US008426322B2

(12) United States Patent
Yamamoto et al.

(10) Patent No.: US 8,426,322 B2
(45) Date of Patent: Apr. 23, 2013

(54) METHOD FOR PRODUCING SEMICONDUCTOR DEVICE AND SEMICONDUCTOR DEVICE

(75) Inventors: Hironori Yamamoto, Kanagawa (JP); Jun Kawahara, Kanagawa (JP); Tomonori Sakaguchi, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 34 days.

(21) Appl. No.: 13/029,866

(22) Filed: Feb. 17, 2011

(65) Prior Publication Data

US 2011/0201212 A1    Aug. 18, 2011

(30) Foreign Application Priority Data

Feb. 18, 2010 (JP) ................................. 2010-033973
Dec. 20, 2010 (JP) ................................. 2010-283111

(51) Int. Cl.
*H01L 21/312* (2006.01)

(52) U.S. Cl.
USPC ...................... 438/789; 438/780; 257/E21.26

(58) Field of Classification Search .................. 438/780, 438/781, 789, 790
See application file for complete search history.

(56) References Cited

U.S. PATENT DOCUMENTS

| 6,936,537 | B2 | 8/2005 | Hogle et al. | |
|---|---|---|---|---|
| 7,220,810 | B2 | 5/2007 | Kunimi et al. | |
| 2002/0192980 | A1* | 12/2002 | Hogle et al. | 438/778 |
| 2004/0018319 | A1* | 1/2004 | Waldfried et al. | 427/508 |
| 2006/0060096 | A1 | 3/2006 | Loccufier et al. | |
| 2009/0246538 | A1 | 10/2009 | Yamamoto et al. | |
| 2010/0219512 | A1 | 9/2010 | Tada et al. | |

FOREIGN PATENT DOCUMENTS

| JP | 2003-045870 | 2/2003 |
|---|---|---|
| JP | 2006-005206 | 1/2006 |
| JP | 2008-263022 | 10/2008 |
| WO | WO2007-032261 | 3/2007 |
| WO | WO2008/010591 | 1/2008 |

* cited by examiner

*Primary Examiner* — Alexander Ghyka
(74) *Attorney, Agent, or Firm* — Young & Thompson

(57) ABSTRACT

In a method for producing a semiconductor device, two or more kinds of organic siloxane compound materials each having a cyclic SiO structure as a main skeleton and having different structures are mixed and thereafter vaporized. Alternatively, those two or more kinds of organic siloxane compound materials are mixed and vaporized simultaneously to produce a vaporized gas. Then, the vaporized gas is transported to a reaction furnace together with a carrier gas. Then, in the reaction furnace, a porous insulating layer is formed by the plasma CVD method or the plasma polymerization method using the vaporized gas.

30 Claims, 28 Drawing Sheets

FIG. 14

|  | FILM DEPOSITION RATE (RELATIVE VALUE) |
|---|---|
| EXAMPLE 9 | 1.18 |
| COMPARATIVE EXAMPLE 2 | 1.00 |
| EXAMPLE 1 | 0.83 |

FIG. 25

| | CLOSE ADHESION STRENGTH (RELATIVE VALUE) |
|---|---|
| EXAMPLE 10 | 1.00 |
| EXAMPLE 11 | 1.17 |

EXAMPLE 13

COMPARATIVE EXAMPLE 4

METHOD FOR PRODUCING SEMICONDUCTOR DEVICE AND SEMICONDUCTOR DEVICE

This application is based on Japanese Patent Application No. 2010-283111, the content of which is incorporated hereinto by reference.

BACKGROUND OF THE INVENTION

1. Technical Field

The present invention relates to a method for producing a semiconductor device and to a semiconductor device.

2. Related Art

Conventionally, in silicon semiconductor integrated circuits (hereafter referred to as LSI), aluminum (Al) or Al alloy has been used as an electrically conductive material. Then, in accordance with a progress in miniaturization of the LSI, copper (Cu) has come to be used as an electrically conductive material in order to achieve reduction of interconnect resistance and higher reliability of the interconnect. Since Cu is easily diffused into a silicon oxide layer, an electrically conductive barrier metal layer for preventing diffusion of Cu is generally used on the side surface and on the bottom surface of the Cu interconnect, and an insulative barrier layer is used on the top surface of the Cu interconnect.

In accordance with the miniaturization of the LSI in recent years, miniaturization of the interconnect dimension is also in progress, thereby raising a problem of increase in the capacitance between the interconnects. For this reason, introduction of a porous low dielectric constant layer is promoted as an insulating interlayer. This is because, by reducing the dielectric constant in the insulating interlayers of a multilayer interconnect in a semiconductor device, increase in the signal transmission speed and reduction of the driving power can be achieved.

For reduction of the dielectric constant of the insulating interlayer, an attempt has been made to increase the porosity of the insulating interlayer by introducing a porogen into the insulating interlayer and eliminating the porogen or to introduce hydrocarbon into the insulating interlayer. A low dielectric constant layer is, for example, a HSQ (Hydrogen Silsesquioxane) layer, a CDO (Carbon doped oxide) layer, an organic layer, or the like. These low dielectric constant layers are formed by the rotation application method, the vapor growth method, or the like.

In recent years, a film deposition method for forming an insulating interlayer having a low specific dielectric constant by using a plurality of source materials has been reported.

International Application No. 2007/032261 discloses a method for forming a porous insulating film by the plasma CVD (Chemical Vapor Deposition) method wherein a mixed gas of a cyclosiloxane material and a straight-chain material containing a part of the chemical structure constituting a organic cyclosiloxane material is used.

International Application No. 2008/010591 discloses a method for mixing a three-membered-ring organic siloxane source material gas and a four-membered-ring organic siloxane source material gas in a reaction chamber and obtaining an insulating film having a high strength and a high close adhesion strength by the plasma CVD or the plasma polymerization method.

Japanese Laid-open patent publication No. 2003/045870 discloses a method for obtaining a dielectric substance having a low k value by allowing a silsesquioxane compound to react with a coupling agent.

Japanese Laid-open patent publication Nos. 2006/005206 and 2008/263022 disclose a method for forming a low dielectric constant layer by using compounds having specific structures, respectively.

SUMMARY

The present inventors have recognized as follows. According to the technique of International Application No. 2007/032261, the straight-chain material containing a part of the chemical structure constituting a organic cyclosiloxane material forms a Si—O—Si bond of high order, whereby an $SiO_2$-oxide-layer-like part (having a k value of about 4) is formed in the layer, making it difficult to lower the specific dielectric constant sufficiently.

According to the technique of International Application No. 2008/010591, a plurality of cyclosiloxane source materials are individually vaporized and thereafter mixed in a gaseous state and, in accordance therewith, the carrier gas mass flow increases. Due to increase in the carrier gas mass flow, the excited ion species in the plasma increase in number, whereby the side chain may be dissociated from the source material, or the cyclic skeleton structure may undergo ring-opening. This may decrease the amount of hydrocarbon contained in the layer or decrease the amount of introduced pores deriving from the cyclic skeleton structure, thereby also making it difficult to lower the specific dielectric constant sufficiently.

The silsesquioxane source material used in the technique of Japanese Laid-open patent publication No. 2003/045870 often has a higher melting point than an ordinary temperature, so that the material must be dissolved by using a solvent before using it as a source material. However, this solvent is also involved in the polymerization reaction in the plasma, making it difficult to select an optimal material for realizing the decrease in the specific dielectric constant.

Thus, it has been difficult to lower the specific dielectric constant of an insulating film easily and sufficiently.

In one embodiment, there is provided a method for producing a semiconductor device, including:

mixing and thereafter vaporizing two or more kinds of organic siloxane compound materials each having a cyclic SiO structure as a main skeleton and having different structures, or alternatively, simultaneously mixing and vaporizing the two or more kinds of organic siloxane compound materials, so as to produce a vaporized gas;

transporting the vaporized gas to a reaction furnace together with a carrier gas; and forming in the reaction furnace a porous insulating film by the plasma CVD method or the plasma polymerization method using the vaporized gas.

According to this production method, the electric dielectric constant of an insulating film can be easily lowered. Hereinafter, the reasons therefor will be described.

First, in this production method, by mixing and thereafter vaporizing two or more kinds of organic siloxane compound materials each having a cyclic SiO structure as a main skeleton and having different structures from each other or alternatively performing the mixing and vaporization simultaneously, the specific dielectric constant of the insulating film can be reduced. In other words, by incorporating the skeleton structure of a cyclic SiO compound into the insulating film, pores can be introduced into the insulating film, and the specific dielectric constant of the insulating film can be lowered.

For introduction of the pores, there is, for example, a method for introducing a pore-forming agent known as a porogen into the layer and subliming it by using energy such as heat, an ultraviolet ray, or an electron beam. This method can realize reduction of the specific dielectric constant in a comparatively easy manner; however, it is difficult to miniaturize the pore size, and moreover, the pores are connected with each other because of the forming method, whereby large pores (open pores) larger than individual pores are formed, resulting in nonuniform layer density distribution. Also, for sublimation of porogen, the substrate must be heated generally up to 350 degree centigrade or higher, thereby giving rise to a cause of inhibiting achievement of a lower-temperature process of a porous insulating film.

On the other hand, in the case of introducing pores into the insulating film by using the skeleton structure of a cyclic SiO compound, the pore diameter can be as small as equal to or less than 1 nm, and the pores can be present as independent pores (closed pores) in the insulating film. As a result of this, an insulating film having a uniform film density distribution can be obtained. For example, cyclosiloxane can control the pore size by changing n of the chemical formula (1), whereby the specific dielectric constant can be controlled.

The same applies to silsesquioxane as well. By changing m of the chemical formula (2), the pore size can be controlled, whereby the specific dielectric constant can be controlled. Here, many silsesquioxanes have a melting point higher than an ordinary temperature, so that it is preferable to use silsesquioxane by dissolving it into a solvent, in consideration of transportation or the like in the film deposition apparatus. The inventors have made eager studies on this solvent, and found out that a cyclosiloxane having an unsaturated hydrocarbon and a hydrocarbon having a large steric hindrance in the side chain is optimal. This is because an unsaturated hydrocarbon crosslinks silsesquioxanes with each other, and a hydrocarbon having a large steric hindrance restrains the excited species from colliding into silsesquioxane to be decomposed in the plasma. Also, since cyclosiloxane acts as a pore, it is effective for reduction of the specific dielectric constant. Examples of the hydrocarbon having a large steric hindrance may include propyl group and butyl group (each including an isomer).

Also, in forming an insulating film by using a plurality of liquid source materials, when the plural source materials are individually vaporized, the amount of carrier gas will be large. Generally, an inert gas is used as the carrier gas. However, since the carrier gas acts also as an excited gas in the plasma, decomposition such as dissociation of the side chain of the source material or ring-opening of the skeleton structure will proceed according as the amount of the carrier gas increases. As a result of this, it will be difficult to introduce fine pores into the insulating film, and also the amount of hydrocarbon that is taken into the insulating film decreases, thereby disadvantageously making it difficult to lower the specific dielectric constant of the insulating film. For this reason, instead of individually vaporizing the plural source materials, the plural source materials are mixed and thereafter vaporized, or the mixing and vaporization of the plural source materials are carried out simultaneously, whereby the carrier gas that transports the source materials can be reduced in amount. This can suppress the decomposition of the source materials, and can lower the dielectric constant of the insulating film.

Also, since the method does not include a high-temperature sublimation of porogen, the method is characterized in that a porous insulating film can be obtained by a low-temperature process such as at 350 degree centigrade or lower, for example, at 200 degree centigrade. In particular, the growth of a porous insulating film by the low-temperature process will be extremely important in the production of a mixed-mount MRAM device in which an MTJ element whose characteristics are considerably deteriorated at a high temperature of 350 degree centigrade or higher is formed within a multilayer interconnect.

In another embodiment, there is provided a semiconductor device having a multilayer interconnect layer including a porous insulating film, wherein at least one layer among the porous insulating film is the porous insulating film produced by the method for producing a semiconductor device according to the present invention.

In still another embodiment, there is provided a semiconductor device having a multilayer interconnect layer including a porous insulating film, wherein at least one layer among the porous insulating film includes plural kinds of Si—O main skeleton structures of organic siloxane in the porous insulating film, and a ratio C/Si of the number of carbon atoms and the number of silicon atoms in the porous insulating film is equal to or more than 2.2.

According to the present invention, the specific dielectric constant of an insulating film can be easily and sufficiently lowered.

BRIEF DESCRIPTION OF THE DRAWINGS

The above and other objects, advantages, and features of the present invention will be more apparent from the following description of certain preferred embodiments taken in conjunction with the accompanying drawings, in which:

FIG. 14 is a view showing the film deposition rate of an insulating film formed in Example 9, an insulating film formed in Comparative Example 2, and an insulating film formed in Example 1;

FIG. 25 is a view showing a result of evaluating a close adhesion strength of an insulating film formed in Example 10 and an insulating film formed in Example 11;

DETAILED DESCRIPTION

Figure 1:
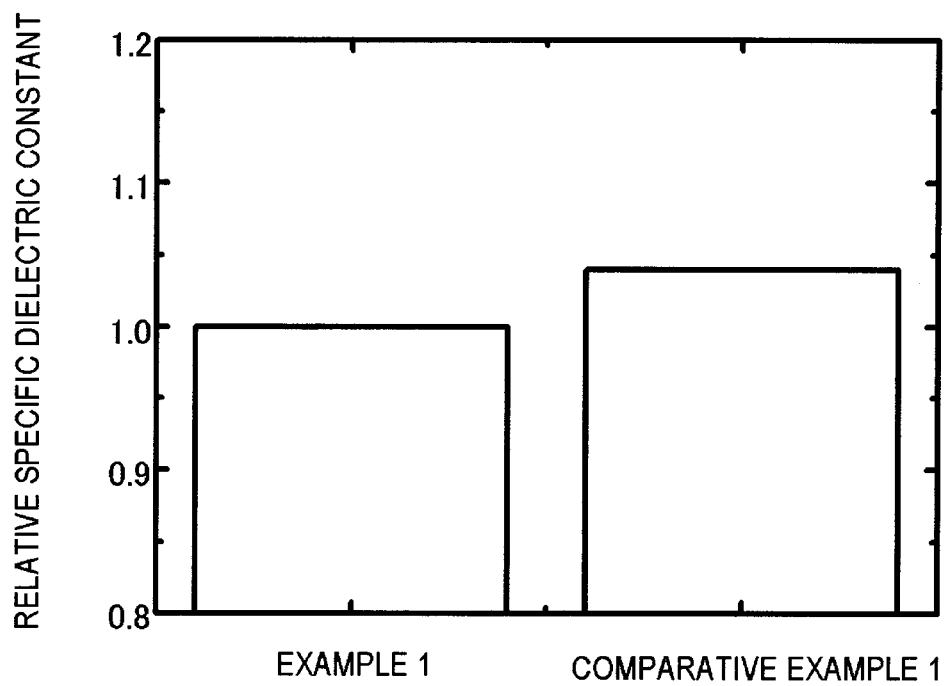
FIG. 1 is a view showing the relative specific dielectric constant of an insulating film formed in Example 1 and an insulating film formed in Comparative Example 1.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiments of the present invention will be described with reference to the attached drawings. Here, in all of the drawings, like constituent elements will be denoted with the same reference numerals, and the description thereof will not be repeated.

In the method for producing a semiconductor device according to the present embodiment, the following steps are carried out. First, two or more kinds of organic siloxane compound materials each having a cyclic SiO structure as a main skeleton and having different structures are mixed and thereafter vaporized, or alternatively, these two or more kinds of organic siloxane compound materials are simultaneously mixed and vaporized, so as to produce a vaporized gas. Subsequently, the vaporized gas is transported to a reaction furnace (chamber 201a) together with a carrier gas. Subsequently, in the reaction furnace, an insulating film is formed by the plasma CVD method or the plasma polymerization method using the vaporized gas. Hereinafter, the details thereof will be described.

Here, the two or more kinds of organic siloxane compound materials serving as source materials may be such that the molecular weights thereof are different from each other.

Also, the two or more kinds of organic siloxane compound materials serving as source materials may be such that the molecular weights of the side chains thereof are different from each other.

In the present embodiment, an insulating film having a low dielectric constant is formed. The insulating film having a low dielectric constant may be, for example, a layer (insulating interlayer) that insulates and isolates interconnect materials, and refers to a material having a lower specific dielectric constant than a silicon oxide layer (having a specific dielectric constant of 4.2) in order to reduce the capacitance between the multilayer interconnects that connect the semiconductor elements. In particular, the porous insulating film may be, for example, a material having a reduced specific dielectric constant by forming pores in a silicon oxide layer, a material having a reduced specific dielectric constant by forming pores in a HSQ (Hydrogen Silsesquioxane) layer, SiOCH, SiOC (for example, Black Diamond™, CORAL™, Aurora™), or the like.

Hereinafter, an organic siloxane compound material having a cyclic SiO structure as a main skeleton (hereafter referred to as a cyclic SiO compound material) that is used as a source material of an insulating film in the method for producing a semiconductor device according to the present embodiment will be described.

It is preferable that at least one of the organic siloxane compound materials has, for example, an unsaturated hydrocarbon group having a carbon number of 2 to 4 and a saturated hydrocarbon group having a carbon number of 1 to 4, and these unsaturated hydrocarbon group and saturated hydrocarbon group are preferably bonded to the Si atom that constitutes the cyclic SiO structure. Here, the unsaturated hydrocarbon group may be, for example, a straight-chain unsaturated hydrocarbon group, and the saturated hydrocarbon group may be, for example, a branched-chain saturated hydrocarbon group.

At least any one of the cyclic SiO compound materials may be a cyclosiloxane represented by the following chemical formula (1).

[chemical formula 1]

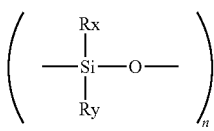

(1)

In the chemical formula (1), n is 2 to 5; each of Rx and Ry is one of a hydrogen atom, an unsaturated hydrocarbon group, and a saturated hydrocarbon group; and each of these unsaturated hydrocarbon groups and saturated hydrocarbon groups is one of vinyl, allyl, methyl, ethyl, propyl, isopropyl, butyl, and tertiary butyl group.

Here, assuming that the structure in the parentheses of the chemical formula (1) is referred to as a unit structure, two unit structures are repeatedly arranged to form a cyclic structure when n is 2. Among these, Rx in the first unit structure and Rx in the second unit structure may be identical to each other or may be different from each other. Similarly, Ry in the first unit structure and Ry in the second unit structure may be identical to each other or may be different from each other.

Similarly, when n is 3 to 5, three to five unit structures are repeatedly arranged to form a cyclic structure. Rx in each unit structure may be different from each other or Rx in any two or more unit structures may be identical to each other (including a case in which Rx in all the unit structures are identical to each other). Also, when n is 3 to 5, Ry in each unit structure may be different from each other or Ry in any two or more unit structures may be identical to each other (including a case in which Ry in all the unit structures are identical to each other).

Also, at least any one of the cyclic SiO compound materials may be a silsesquioxane represented by the following chemical formula (17).

[chemical formula 2]

$(Rz\text{-}SiO_{3/2})_m$ (17)

In the chemical formula (17), m satisfies m>3 (m≧4); Rz is one of a hydrogen atom, an unsaturated hydrocarbon group, and a saturated hydrocarbon group; and each of the unsaturated hydrocarbon groups and saturated hydrocarbon groups is one of vinyl, allyl, methyl, ethyl, propyl, isopropyl, and butyl group.

Here, assuming that the structure in the parentheses of the chemical formula (17) is referred to as a unit structure, Rz in each unit structure may be different from each other or Rz in any two or more unit structures may be identical to each other (including a case in which Rz in all the unit structures are identical to each other).

(First Embodiment)

In the present embodiment, an insulating film suitable as an insulating interlayer is formed by mixing at least two or more kinds of cyclic SiO compound materials and thereafter vaporizing the mixture in the same vaporizer and performing the plasma vapor growth method using this vaporized gas.

In the present embodiment, for example, the source materials all may be a cyclosiloxane represented by the chemical formula (1). As Rx and Ry in the chemical formula (1), it is preferable to use at least one straight-chain unsaturated hydrocarbon group having a carbon number of 2 to 4 or branched-chain saturated hydrocarbon group having a carbon number of 3 to 4. Each of the straight-chain unsaturated hydrocarbon groups and the branched-chain saturated hydrocarbon groups is, for example, one of vinyl, allyl, methyl, ethyl, propyl, isopropyl, butyl, and tertiary butyl group. Also, n is preferably set to be 3 or 4. Specifically, the cyclosiloxane represented by the chemical formula (1) may be, for example, a tetravinylcyclotetrasiloxane derivative represented by the chemical formula (2), a trivinylcyclotetrasiloxane derivative represented by the chemical formula (3), a divinylcyclotetrasiloxane derivative represented by the chemical formulas (4) and (5), a vinylcyclotetrasiloxane derivative represented by the chemical formula (6), a trivinylcyclotrisiloxane derivative represented by the chemical formula (7), a divinylcyclotrisiloxane derivative represented by the chemical formula (8), or a vinylcyclotrisiloxane derivative represented by the chemical formula (9).

[chemical formula 3]

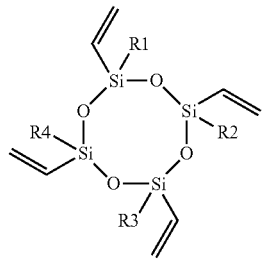

(2)

[chemical formula 4]

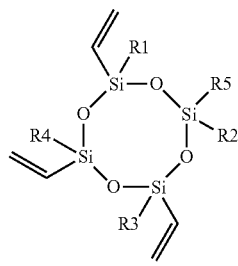

(3)

[chemical formula 5]

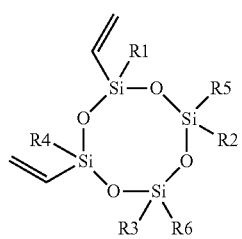

(4)

[chemical formula 6]

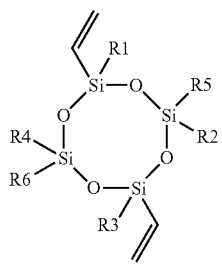

(5)

[chemical formula 7]

(6)

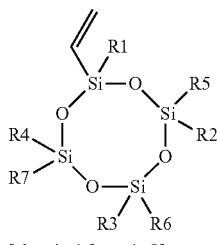

[chemical formula 8]

(7)

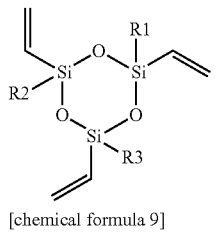

[chemical formula 9]

(8)

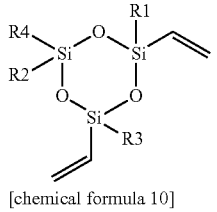

[chemical formula 10]

(9)

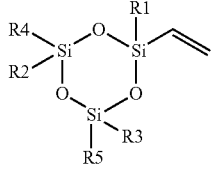

In the chemical formulas (2) to (9), R1 to R7 are a hydrogen atom or a hydrocarbon group having a carbon number of 1 to 4 (unsaturated hydrocarbon group or saturated hydrocarbon group), and R1 to R7 may be different from each other or any two or more of R1 to R7 may be identical to each other (including a case in which all of R1 to R7 are identical to each other). The hydrocarbon group (unsaturated hydrocarbon group or saturated hydrocarbon group) is one of vinyl, allyl, methyl, ethyl, propyl, isopropyl, and butyl group.

In addition to this, as the cyclosiloxane, those having a structure represented by the following chemical formulas (10) to (16) may be used.

[chemical formula 11]

(10)

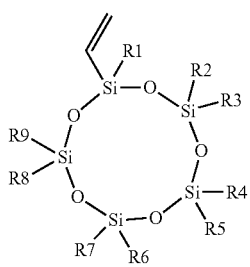

[chemical formula 12]

(11)

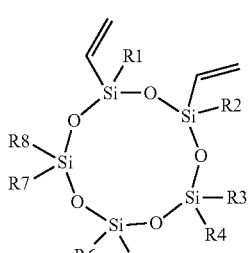

[chemical formula 13]

(12)

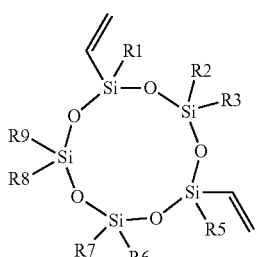

[chemical formula 14]

(13)

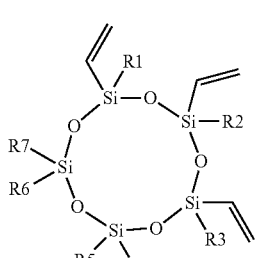

[chemical formula 15]

(14)

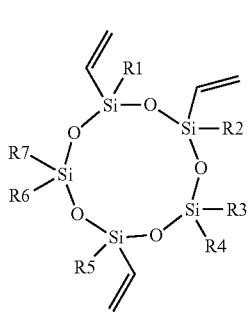

[chemical formula 16]

(15)

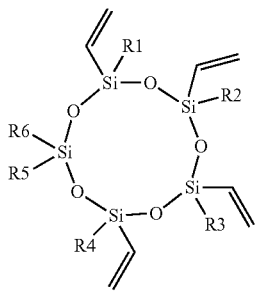

[chemical formula 17]

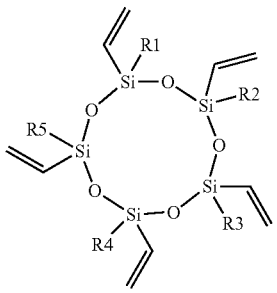
(16)

In the chemical formulas (10) to (16), R1 to R9 are a hydrogen atom or a hydrocarbon group having a carbon number of 1 to 4 (unsaturated hydrocarbon group or saturated hydrocarbon group), and R1 to R9 may be different from each other or any two or more of R1 to R9 may be identical to each other (including a case in which all of R1 to R9 are identical to each other). The hydrocarbon group (unsaturated hydrocarbon group or saturated hydrocarbon group) is one of vinyl, allyl, methyl, ethyl, propyl, isopropyl, and butyl group.

As at least any one of the cyclic SiO compound materials (organic siloxane compound materials), one having a structure of the chemical formula (1), where Rx is a vinyl group, Ry is a methyl group, and n is 3 to 5, can be used.

Also, as at least any one of the cyclic SiO compound materials (organic siloxane compound materials), one having a structure of the chemical formula (1), where Rx is a vinyl group, Ry is an isopropyl group, and n is 3 to 5, can be used.

Also, as at least any one of the cyclic SiO compound materials (organic siloxane compound materials), one having a structure of the chemical formula (1), where Rx is a vinyl group, Ry is a tertiary butyl group, and n is 3 to 5, can be used.

Also, as at least any one of the cyclic SiO compound materials (organic siloxane compound materials), one having a structure of the chemical formula (1), where Rx is a vinyl group, Ry is a (normal)propyl group, and n is 3 to 5, can be used.

Also, as at least any one of the cyclic SiO compound materials (organic siloxane compound materials), one having a structure of the chemical formula (1), where Rx is a vinyl group, Ry is a sec-butyl group, and n is 3 to 5, can be used.

More preferably, as the cyclosiloxane, tetravinyltetramethylcyclotetrasiloxane represented by the following chemical formula (29), trivinyltriisopropylcyclotrisiloxane represented by the chemical formula (30), or tetravinyltetraisopropylcyclotetrasiloxane represented by the chemical formula (31) can be used.

[chemical formula 18]

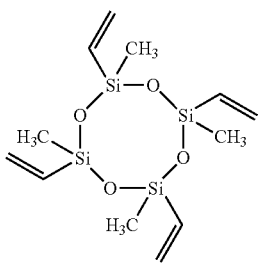
(29)

[chemical formula 19]

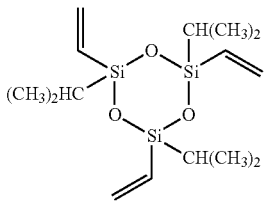
(30)

[chemical formula 20]

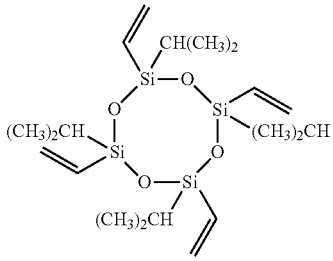
(31)

Alternatively, in the present embodiment, as the source material, a silsesquioxane (basket-form silsesquioxane) represented by the chemical formula (17) can also be used, for example. In the chemical formula (17), m is equal to or more than 4, and Rz is one of a hydrogen atom, an unsaturated hydrocarbon group, and a saturated hydrocarbon group. Each of these unsaturated hydrocarbon groups and saturated hydrocarbon groups is one of vinyl, allyl, methyl, ethyl, propyl, isopropyl, and butyl group.

The silsesquioxane represented by the chemical formula (17) may specifically have a structure of any one of the following chemical formulas (18) to (20), for example. Here, m>3 (m≧4).

[chemical formula 21]

(H2C=CH—SiO$_{3/2}$)m      (18)

[chemical formula 22]

(CH3-HC=CH—SiO$_{3/2}$)m      (19)

[chemical formula 23]

(H2C=CCH3-SiO$_{3/2}$)m      (20)

Here, in the case of mixing two kinds of organic siloxane compound materials, one of the organic siloxane compound materials may be set to be silsesquioxane; the other one may be set to be a cyclosiloxane having a structure of the chemical formula (1); Rx and Ry thereof may be set to be an unsaturated hydrocarbon or a hydrocarbon having a large steric hindrance; and the source material obtained by dissolving silsesquioxane into cyclosiloxane may be vaporized to produce a vaporized gas. The unsaturated hydrocarbon may be, for example, a vinyl group. One example of the hydrocarbon having a large steric hindrance is a normal (n)-propyl group or n-butyl group. Further, it may be an iso(i)-propyl group or a tertiary(t)-butyl group having a branched structure with a large steric hindrance effect. Further, by using a source material in which plural kinds of cyclosiloxanes having a different number of ring members from each other are mixed in addition to the steric hindrance effect of each of the above-described cyclosiloxane side chains, the arrangement of the cyclosiloxane can be further disturbed to introduce a space between the cyclosiloxanes. This space acts as a pseudo pore, thereby producing an effect of further reducing the dielectric constant.

The silsesquioxane represented by the chemical formula (17) may be specifically a silsesquioxane having a structure represented by any one of the following chemical formulas (21) to (24), for example.

[chemical formula 24]

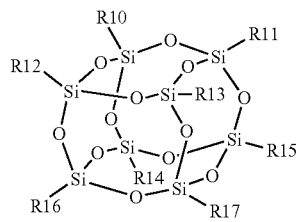
(21)

[chemical formula 25]

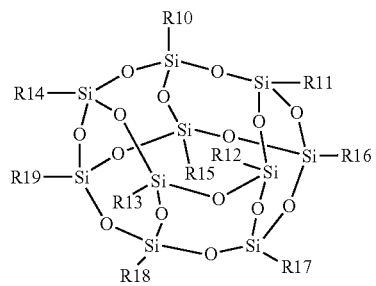
(22)

[chemical formula 26]

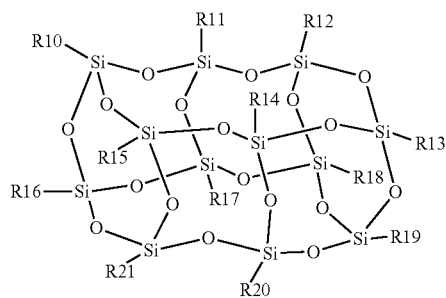
(23)

[chemical formula 27]

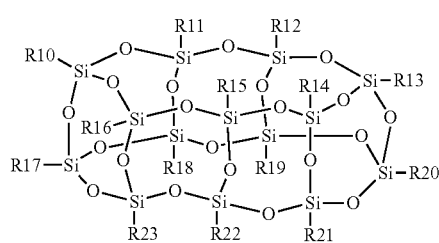
(24)

In the chemical formulas (21) to (24), R10, R11, R12, R13, R14, R15, R16, R17, R18, R19, R20, R21, R22, and R23 are each an unsaturated hydrocarbon group or a saturated hydrocarbon group, and each of the unsaturated hydrocarbon groups and saturated hydrocarbon groups is one of vinyl, allyl, methyl, ethyl, propyl, isopropyl, and butyl group. R10 to R23 may be different from each other or any two or more of R10 to R23 may be identical to each other (including a case in which all of R10 to R23 are identical to each other).

Alternatively, the silsesquioxane represented by the chemical formula (17) may be specifically a silsesquioxane having a structure represented by any one of the following chemical formulas (25) to (28), for example.

[chemical formula 28]

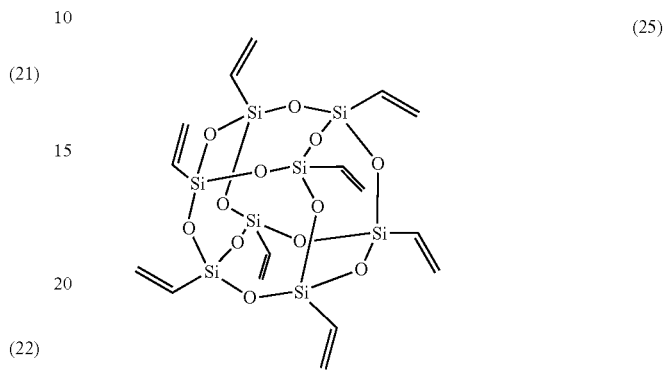
(25)

[chemical formula 29]

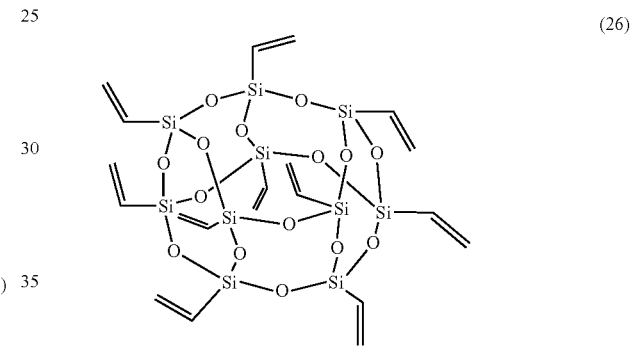
(26)

[chemical formula 30]

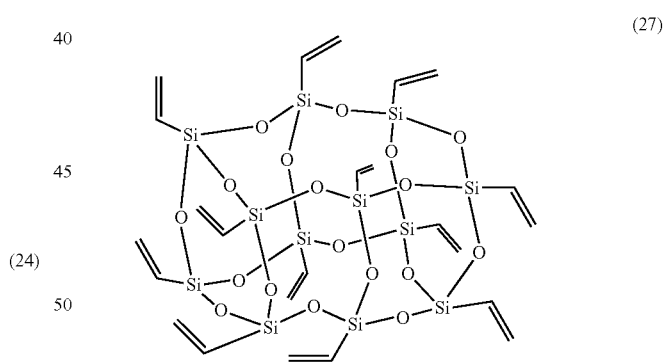
(27)

[chemical formula 31]

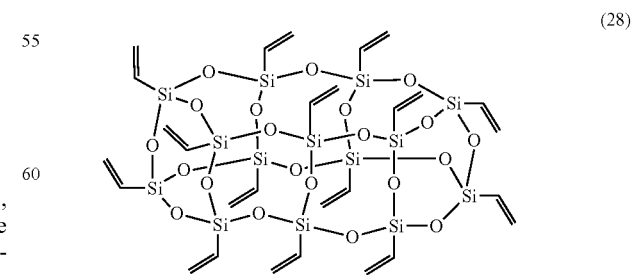
(28)

In the case of mixing two kinds of organic siloxane compound materials, the mixing amount can be determined in accordance with the number of unsaturated hydrocarbon groups in the side chains that the molecules of the respective source materials have. One example will be given. Assuming that, among the two kinds of the organic siloxane compound materials, a first source material has X unsaturated hydrocarbon groups and that a second source material has Y unsaturated hydrocarbon groups, the mixing ratio (molar ratio) of the first and second source materials is preferably set to be such that the ratio of the second source material relative to the first source material being assumed to be 1 is within a range of plus and minus 25% with X/Y being a center. Namely, the ratio of the second source material is preferably set to be equal to or more than 0.75(X/Y) and equal to or less than 1.25(X/Y). Here, in particular, when two kinds of cyclosiloxanes having an unsaturated hydrocarbon group are mixed, such a mixing ratio is preferably adopted.

Further, in the case of mixing two kinds of organic siloxane compound materials, the mixing ratio can be determined also in accordance with the value of n (n=2 to 5) of the chemical formula (1). One example will be given. Assuming that, among the two kinds of the cyclosiloxanes, a first source material is a cyclosiloxane having a structure of the chemical formula (1) and n is n=E (E=1 to 5), and that a second source material is a cyclosiloxane having a structure of the chemical formula (1) and n is n=F (it may be that E=F), the mixing ratio (molar ratio) thereof is preferably set to be such that the ratio of the second source material relative to the first source material being assumed to be 1 is within a range of plus and minus 25% with E/F being a center. Namely, the ratio of the second source material is preferably set to be equal to or more than 0.75(E/F) and equal to or less than 1.25(E/F).

Figure 6:
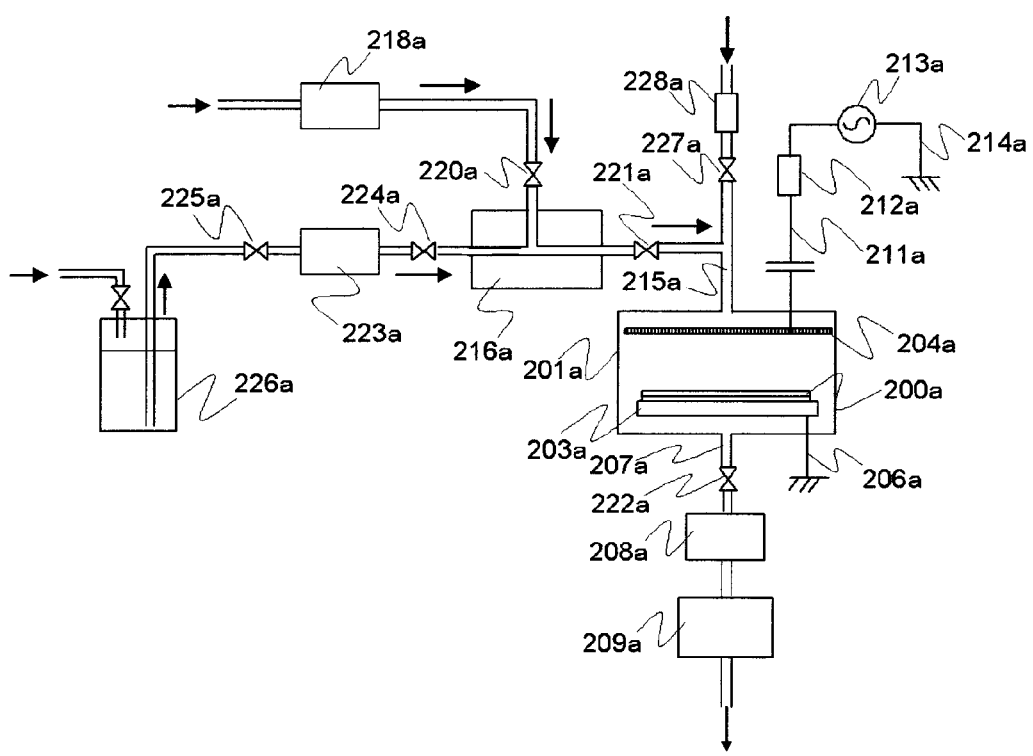
FIG. 6 is a model view showing one example of a plasma generating apparatus used in the method for producing a semiconductor device according to a first embodiment.

FIG. 6 is a model view showing one example of a plasma generating apparatus used in the method for producing a semiconductor device according to the present embodiment.

In the plasma generating apparatus shown in FIG. 6, a chamber (reaction furnace) 201*a* is connected to a vacuum pump 209*a* via an exhaust pipe 207*a*, an exhaust valve 222*a*, and a cooling trap 208*a*. For this reason, the pressure within the chamber 201*a* can be reduced by operating the vacuum pump 209*a*. Also, the pressure (vacuum degree) within the chamber 201*a* can be controlled by adjusting the throttle valve (not illustrated) placed between the chamber 201*a* and the vacuum pump 209*a*. In the inside of the chamber 201*a*, a stage 203*a* having a heating function is provided. On the stage 203*a*, a substrate (for example, a silicon substrate 200*a*) serving as an object of forming a film is mounted. The source material used for forming an insulating film is a liquid source material obtained by mixing two or more kinds of cyclic SiO compound materials, and is put and enclosed into a source material reservoir tank 226*a*. This source material is pressure-transported from the source material reservoir tank 226*a* via a pipe, and is introduced into a vaporizer 216*a* via a valve 225*a*, a liquid mass flow controller 223*a*, and a valve 224*a* in this order. An inert gas used for pressure transportation may be, for example, helium, argon, xenon, or nitrogen. The mass flow of the source material introduced into the vaporizer 216*a* is adjusted to a desired amount by the liquid mass flow controller 223*a*. The source material is vaporized in the vaporizer 216*a* to become a vaporized gas. This vaporized gas is supplied into the chamber 201*a* by passing through a pipe 215*a* via a valve 221*a*. The pipe 215*a* is heated by a heater not illustrated and the temperature thereof is maintained, whereby the re-liquefaction of the vaporized source material (cyclosiloxane) is suppressed.

In this manner, two or more kinds of organic siloxane compound materials are mixed and stored as a liquid source material in the source material reservoir tank 226*a* at an ordinary temperature and under an ordinary pressure, and the liquid source material is guided out of the source material reservoir tank 226*a* and thereafter vaporized to produce a vaporized gas.

Into the vaporizer 216*a*, a carrier gas can be introduced through a pipe via a gas mass flow controller 218*a* and a valve 220*a*. As the carrier gas, an inert gas such as helium (He), argon (Ar), neon (Ne), xenon (Xe), or nitrogen ($N_2$) can be used. The carrier gas transports the vaporized gas (cyclosiloxane gas) produced through vaporization by heating the source material under reduced pressure in the vaporizer 216*a* into the chamber 201*a* via a valve 221*a* and through a pipe 215*a*. The mass flow of the carrier gas is adjusted to a desired amount by the gas mass flow controller 218*a*. The heating temperature for vaporization of the source material is preferably adjusted to be 40 to 180 degree centigrade, though it depends on the vapor pressure characteristics of the source material.

Also, into the chamber 201*a*, an oxidizing gas such as oxygen ($O_2$), carbon dioxide ($CO_2$), carbon monoxide (CO), nitrogen monoxide ($N_2O$), or nitrogen dioxide ($NO_2$) can be supplied as an additive gas through a pipe and via an additive gas mass flow controller 228*a* and a valve 227*a*.

By using only a source material gas (cyclosiloxane gas) and an inert gas (carrier gas, excited gas) in forming the film, the apparatus can be simplified, and also the amount of the gas put to use can be reduced, thereby advantageously simplifying the film deposition and facilitating the control of the film deposition.

Within the chamber 201*a*, a shower head 204*a* having a plurality of through-holes is placed. The cyclosiloxane gas and the carrier gas introduced into the chamber 201*a* are dispersed by the shower head 204*a*. Here, a gas dispersion plate (not illustrated) may be provided at the top of the shower head 204*a*.

To the shower head 204*a*, a high-frequency power supply (RF(Radio-Frequency) power source) 213*a* is connected via a power electric supply line 211*a* and a matching controller 212*a*. The high-frequency power supply 213*a* is grounded via an grounding conductor 214*a*, and the stage 203*a* is grounded via an grounding conductor 206*a*. Further, from the high-frequency power supply 213*a*, a high-frequency power (RF power) is supplied between the shower head 204*a* and the stage 203*a*. The high frequency as referred to herein refers to a frequency of 1 MHz or higher. Representatively, 13.56 MHz and multiples thereof can be raised as examples. Also, a low-frequency power source (not illustrated) that generates power of less than 1 MHz may be placed in addition to the high-frequency power supply. This low-frequency power source may be connected to the shower head 204*a* in the same manner as the high-frequency power supply 213*a*, or connected to the stage 203*a*.

The mass flow of the carrier gas that is let to flow into the vaporizer 216*a* and the vaporizing temperature within the vaporizer 216*a* are controlled so that the vapor pressure will be below the saturation vapor pressure when the source material gas is vaporized in the vaporizer 216*a*. For this reason, even if the respective boiling points or saturation vapor pressures of the mixed two or more kinds of cyclic SiO compound materials are different from each other, these source materials can be vaporized without deviation, so that it is possible to obtain a vaporized gas in which the mixing ratio within the source material reservoir tank 226*a* is maintained as it is.

The source material gas and the carrier gas introduced into the chamber 201*a* through the pipe 215*a* are made into a plasma by an power applied between the shower head 204*a* and the stage 203a, and is deposited to form a film on the surface of the silicon substrate 200a that is placed on the stage 203a.

The partial pressure of the source material in the chamber 201a is preferably selected suitably within a range of 0.1 to 3 Torr. The atmosphere pressure of the chamber 201a at the time of forming the film is preferably set to be within a range of 1 to 6 Torr by using the vacuum pump 209a. The surface temperature of the silicon substrate 200a at the time of forming the film can be suitably set to be within a range of 100 to 400 degree centigrade, preferably 250 to 400 degree centigrade in particular, by heating the silicon substrate 200a by the stage 203a. Depending on the kinds of the compound materials that are put to use, supply of the carrier gas to the chamber 201a can be started prior to supply of the source material gas.

When a film is formed under such a condition, the molecules of the cyclic SiO compound materials serving as a source material gas are excited by the plasma and, in an activated state, reaches the surface of the silicon substrate 200a to form an insulating film on the surface. When the insulating film includes a group having an unsaturated bond, the molecules of the organic silicon compounds activated by being excited by the plasma reach the surface of the silicon substrate 200a and receive heat energy further from the stage 203a, whereby the unsaturated bond existing in the aforementioned group undergoes ring-opening. Also, the thermal polymerization reaction proceeds among the molecules activated by the plasma, and the insulating film grows on the silicon substrate.

In this manner, in the present embodiment, an insulating film is formed on the silicon substrate 200a by the plasma CVD method, for example. In the present embodiment, the plasma CVD method is a technique, for example, of continuously supplying a gasified source material into the chamber 201a under reduced pressure, bringing the molecules into an excited state by the plasma energy, and forming a continuous film on the silicon substrate 200a by vapor phase reaction, substrate surface reaction, or the like. Alternatively, in the present embodiment, an insulating film may be formed on the silicon substrate 200a by the plasma polymerization method. In the case of the plasma polymerization method, the plasma polymerization reaction sufficiently proceeds at the interface between the silicon substrate 200a and the source material gas by using heat energy in combination, whereby an insulating film rich in close adhesion property can be grown.

Here, for cleaning the chamber 201a, a gas such as nitrogen trifluoride ($NF_3$), sulfur hexafluoride ($SF_6$), tetrafluoromethane ($CF_4$), or hexafluoroethane ($C_2F_6$) can be used, and these gases may be used as a mixed gas with oxygen gas, ozone gas, or the like in accordance with the needs. The cleaning gas is supplied to the chamber 201a via a cleaning gas supplying pipe (not illustrated). In the same manner as at the time of forming the film, a high-frequency power is applied between the shower head 204a and the stage 203a, whereby a plasma is induced to clean the chamber 201a. It is effective also to use a cleaning gas that is brought into a plasma state in advance by using a remote plasma or the like.

EXAMPLE 1

For forming an insulating film, first and second organic cyclosiloxanes respectively represented by the chemical formula (1) were used as source materials. Among these, as the first organic cyclosiloxane, a organic cyclosiloxane (2,4,6-triisopropyl-2,4,6-trivinylcyclotrisiloxane) in which R1 (Rx) is a vinyl group, R2 (Ry) is an isopropyl group, and n=3 was used. Also, as the second organic cyclosiloxane, a organic cyclosiloxane (2,4,6,8-tetravinyl-2,4,6,8-tetramethylcyclotetrasiloxane) in which R1 (Rx) is a vinyl group, R2 (Ry) is a methyl group, and n=4 was used. For forming the film, a plasma generating apparatus shown in FIG. 6 was used. Into the source material reservoir tank 226a, a liquid source material obtained by mixing these two kinds of source materials in a molar ratio of 4:3 (first organic cyclosiloxane being 4 relative to second organic cyclosiloxane being 3) was put and enclosed. As a carrier gas, He of 500 sccm was introduced into the vaporizer 216a via the gas mass flow controller 218a. For this reason, the mass flow of He introduced into the chamber 201a is 500 sccm. The film was formed to have a thickness of 100 nm on a p-type silicon substrate having a resistance of equal to or less than 0.1Ω·cm with 300 mmφ. Thereafter, the specific dielectric constant of the insulating film formed in Example 1 was measured by using an Hg prober.

COMPARATIVE EXAMPLE 1

Figure 12:
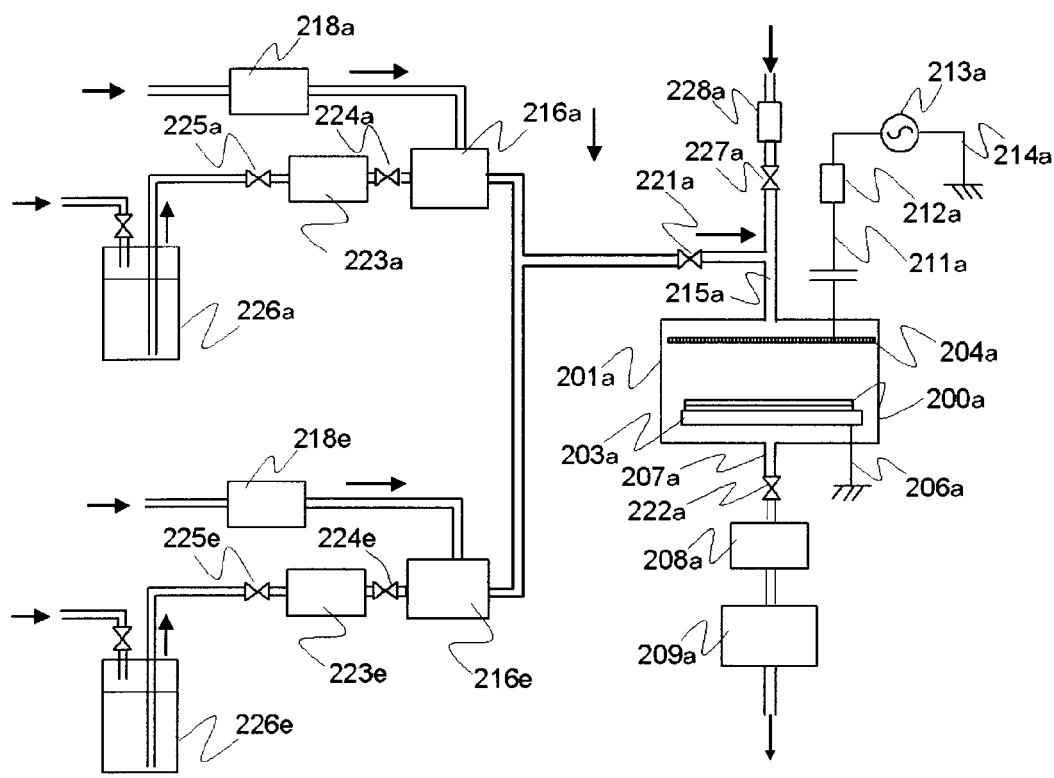
FIG. 12 is a model view showing a plasma generating apparatus used in Comparative Example 1.

FIG. 12 is a model view showing a construction of a plasma generating apparatus used in the method for producing a semiconductor device according to Comparative Example 1. In addition to the constituent elements of the plasma generating apparatus shown in FIG. 6, the plasma generating apparatus shown in FIG. 12 includes a source material reservoir tank 226e, a valve 225e, a liquid mass flow controller 223e, a valve 224e, a gas mass flow controller 218e, and a vaporizer 216e that are respectively similar to a source material reservoir tank 226a, a valve 225a, a liquid mass flow controller 223a, a valve 224a, a gas mass flow controller 218a, and a vaporizer 216a. The source material in the source material reservoir tank 226a is vaporized in the vaporizer 216a, and the source material in the source material reservoir tank 226e is vaporized in the vaporizer 216e, and the resultants are mixed with each other and supplied into the chamber 201a. In the present Comparative Example 1, a first organic cyclosiloxane was put into the source material reservoir tank 226a and enclosed, and the second organic cyclosiloxane is put into the source material reservoir tank 226e and enclosed. The structures of the first and second organic cyclosiloxanes are respectively the same as the structures of Example 1. In the present Comparative Example 1, the mass flow of the first organic cyclosiloxane that was press-transported from the source material reservoir tank 226a to the vaporizer 216a and the mass flow of the second organic cyclosiloxane that was press-transported from the source material reservoir tank 226e to the vaporizer 216e were adjusted so that the mixing ratio of the first and second organic cyclosiloxanes would be 4:3 in a molar ratio in the same manner as in Example 1. Also, the carrier gas He was introduced respectively at 500 sccm into the vaporizers 216a, 216e via the gas mass flow controllers 218a, 218e. For this reason, the He mass flow introduced into the chamber 201a is 1000 sccm. As the silicon substrate, the same one as in Example 1 was used. Then, the specific dielectric constant of the formed insulating film was measured by the same method as in Example 1.

FIG. 1 shows a result of measuring the specific dielectric constant of Example 1 and Comparative Example 1. Assuming that the specific dielectric constant of the insulating film formed in Example 1 is 1 (relative value), the specific dielectric constant of the insulating film formed in Comparative Example 1 is 1.04 (relative value), whereby the film of the Example 1 shows a lower specific dielectric constant. This is due to the fact that the decomposition of cyclosiloxane serving as a source material was suppressed because, in Example 1, the amount of the carrier gas that is put to use can be reduced as compared with Comparative Example 1.

Figure 2:
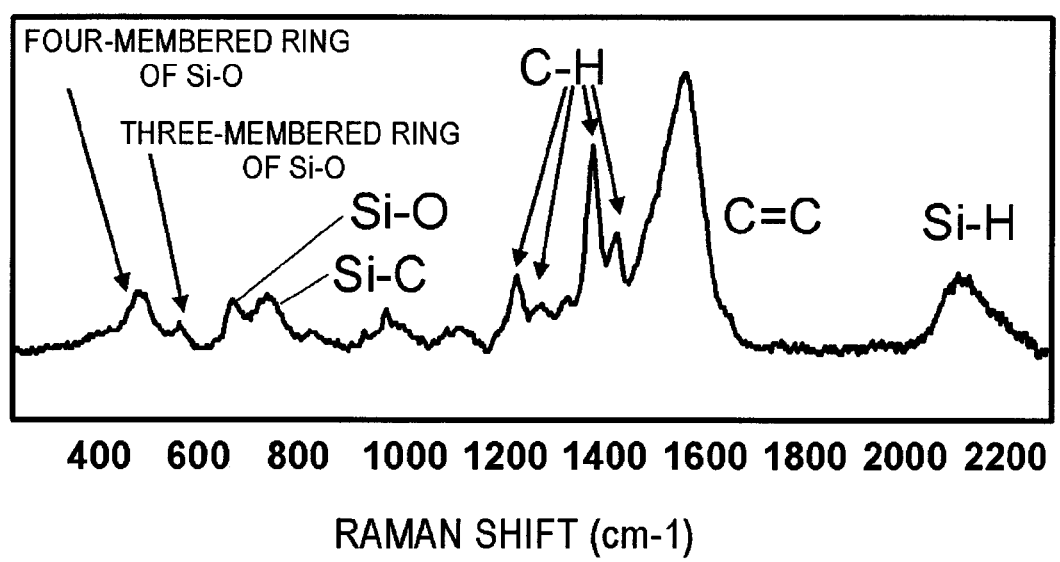
FIG. 2 is a view showing a result obtained by analyzing an insulating film formed in Example 1 by the Raman spectroanalysis method.

FIG. 2 is a view showing a result of analyzing the structure of the insulating film formed in Example 1 by using the Raman spectroanalysis method. As shown in FIG. 2, both of a three-membered ring structure of Si—O with n=3 and a four-membered ring structure of Si—O with n=4 were confirmed. Here, in the three-membered ring structure of Si—O, the pore diameter is comparatively small, so that the effect of reducing the specific dielectric constant is smaller; however, the elastic modulus of the insulating film can be increased. On the other hand, in the four-membered ring structure of Si—O, the pore diameter is comparatively large, so that the effect of reducing the specific dielectric constant will be larger, though the elastic modulus of the insulating film will be weak. For this reason, by allowing the three-membered ring structure and the four-membered ring structure of Si—O to be present in a mixed manner at a desired ratio, a desired elastic modulus can be obtained while obtaining a desired specific dielectric constant reduction effect.

Figure 3:
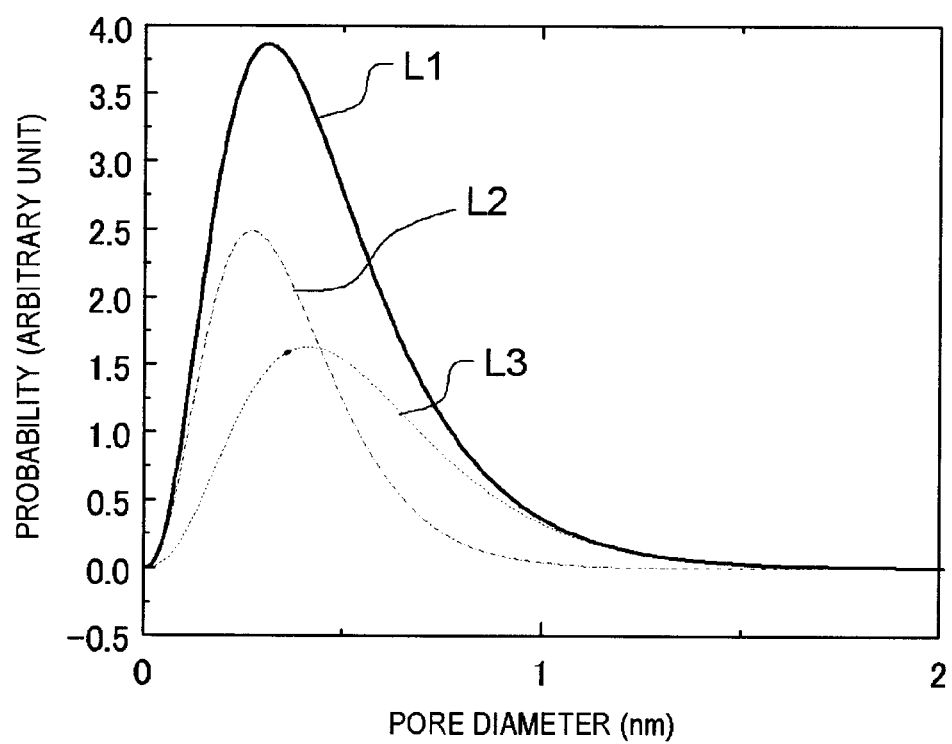
FIG. 3 is a view showing a result obtained by analyzing an insulating film formed in Example 1 by the small-angle X-ray scattering method.

FIG. 3 is a view showing a result (curve L1) of analyzing the distribution of the pore diameter of the insulating film formed in Example 1 by the small-angle X-ray scattering method. As shown in FIG. 3, when the distribution curve of the pore diameter of the insulating film is subjected to peak decomposition, the curve could be decomposed into a pore distribution (curve L2) deriving from the first organic cyclosiloxane (2,4,6-triisopropyl-2,4,6-trivinylcyclotrisiloxane) and a pore distribution (curve L3) deriving from the second organic cyclosiloxane (2,4,6,8-tetravinyl-2,4,6,8-tetramethylcyclotetrasiloxane). Here, the peak of the curve L2 shown in FIG. 3 is the same as the peak of the pore distribution (not illustrated) in the case where the first organic cyclosiloxane (2,4,6-triisopropyl-2,4,6-trivinylcyclotrisiloxane) is used as a source material. In the case where the first organic cyclosiloxane (2,4,6-triisopropyl-2,4,6-trivinylcyclotrisiloxane) is used as a source material, a three-membered structure of Si—O can be observed by the Raman spectroanalysis method. On the other hand, the peak of the curve L3 shown in FIG. 3 is the same as the peak of the pore distribution (not illustrated) in the case where the second organic cyclosiloxane (2,4,6,8-tetravinyl-2,4,6,8-tetramethylcyclotetrasiloxane) is used as a source material. In the case where the second organic cyclosiloxane (2,4,6,8-tetravinyl-2,4,6,8-tetramethylcyclotetrasiloxane) is used as a source material, a four-membered structure of Si—O can be observed by the Raman spectroanalysis method. From the results shown in FIG. 3, it will be understood that the distribution of the pore diameter in the insulating film can be controlled by suitably adjusting the combination of the organic cyclosiloxanes serving as source materials. Here, in Example 1, an Example has been shown in which a vinyl group is used as an unsaturated hydrocarbon group that is one of the side chains of a organic cyclosiloxane; however, an equivalent effect is obtained when it has at least one unsaturated hydrocarbon group and the carbon number is 2 or more. Also, an Example has been used in which a methyl group is used as a saturated hydrocarbon group of the second organic cyclosiloxane; however, an equivalent effect is obtained when it is a normal propyl group, a normal butyl group, a tertiary butyl group, or the like.

EXAMPLE 2

When the steric hindrance effect of the side chains of the first and second organic cyclosiloxanes increases, it will be more effective for reduction of the dielectric constant. As source materials for forming an insulating film, first and second organic cyclosiloxanes were used. Among these, as the first organic cyclosiloxane, one having the same structure as the first organic cyclosiloxane of Example 1 was used (therefore, n=3). On the other hand, as the second organic cyclosiloxane, one being different from the first organic cyclosiloxane of Example 2 only in that the value of n was 4 (instead of 3) was used. Specifically, as the second organic cyclosiloxane to the first organic cyclosiloxane (2,4,6-triisopropyl-2,4,6-trivinylcyclotrisiloxane), a organic cyclosiloxane (2,4,6,8-tetravinyl-2,4,6,8-tetraisopropylcyclotetrasiloxane) in which R1 (Rx) is a vinyl group, R2 (Ry) is isopropyl, and n=4 was used. For forming the film, a plasma generating apparatus shown in FIG. 6 was used. Then, into the source material reservoir tank 226a, a liquid source material obtained by mixing these two kinds of source materials in a molar ratio of 1:1 (first organic cyclosiloxane being 1 relative to second organic cyclosiloxane being 1) was put and enclosed. The kind and the mass flow of the carrier gas were set to be the same as those of Example 1, and the same silicon substrate as that of Example 1 was used.

EXAMPLE 3

As source materials for forming an insulating film, first and second organic cyclosiloxanes were used. Among these, as the first organic cyclosiloxane, one having the same structure as that of Example 2 was used (therefore, n=3). On the other hand, as the second organic cyclosiloxane, one being different from the second organic cyclosiloxane of Example 2 only in that the value of n was 5 (instead of 4) was used. For forming the film, a plasma generating apparatus shown in FIG. 6 was used. Then, into the source material reservoir tank 226a, a liquid source material obtained by mixing these two kinds of source materials in a molar ratio of 1:1 (first organic cyclosiloxane being 1 relative to second organic cyclosiloxane being 1) was put and enclosed. The kind and the mass flow of the carrier gas were set to be the same as those of Example 2, and the same silicon substrate as that of Example 2 was used.

EXAMPLE 4

As source materials for forming an insulating film, first to third organic cyclosiloxanes were used. Among these, as the first and second organic cyclosiloxanes, those respectively having the same structures as those of Example 2 were used (therefore, the first organic cyclosiloxane corresponds to n=3, and the second organic cyclosiloxane corresponds to n=4). On the other hand, as the third organic cyclosiloxane, one having the same structure as the second organic cyclosiloxane of Example 3 was used (therefore, n=5). For forming the film, a plasma generating apparatus shown in FIG. 6 was used. Then, into the source material reservoir tank 226a, a liquid source material obtained by mixing these three kinds of source materials in a molar ratio of 1:1:1 (first organic cyclosiloxane being 1 and second organic cyclosiloxane also being 1 relative to third organic cyclosiloxane being 1) was put and enclosed. The kind and the mass flow of the carrier gas were set to be the same as those of Example 2, and the same silicon substrate as that of Example 2 was used.

Figure 4:
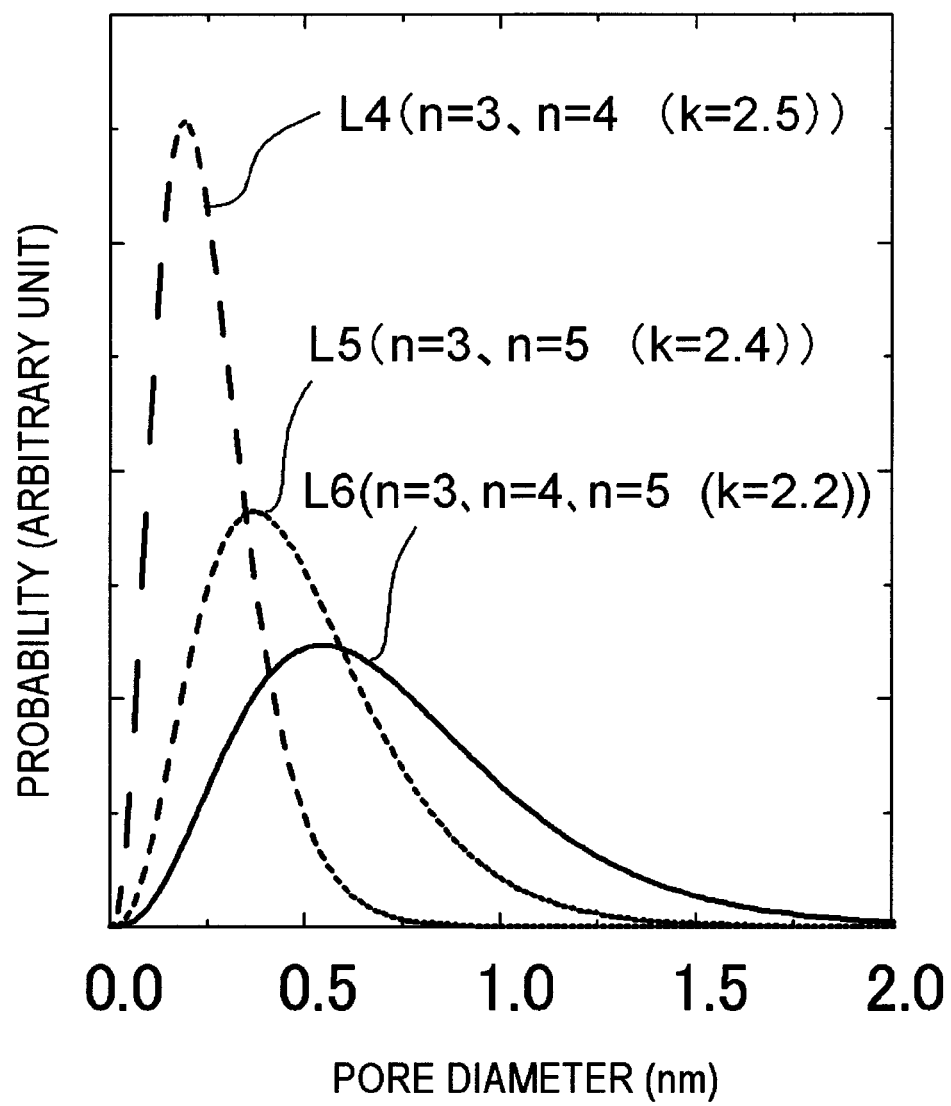
FIG. 4 is a view showing a result obtained by analyzing an insulating film formed in Examples 2 to 4 by the small-angle X-ray scattering method.

FIG. 4 is a view showing a result of analyzing the distribution of the pore diameter of the insulating film formed in each of Examples 2 to 4 by the small-angle X-ray scattering method. In FIG. 4, the curve L4 represents the result of Example 2; the curve L5 represents the result of Example 3; and the curve L6 represents the result of Example 4, respectively. Here, in each of the Examples 2 to 4, the specific dielectric constant of the insulating film was measured by using an Hg prober, with a result that the specific dielectric constant was k=2.5 in Example 2; the specific dielectric constant was k=2.4 in Example 3; and the specific dielectric constant was k=2.2 in Example 4. From the result of FIG. 4, it will be understood that, according as a organic cyclosiloxane having a larger value of n is mixed, the average pore diameter will be larger, and a film having a lower specific dielectric constant (k) (for example, equal to or less than 2.4) can be obtained. Here, in Examples 2 to 4, Examples have been shown in which a vinyl group is used as an unsaturated hydrocarbon group that is one of the side chains of the organic cyclosiloxane; however, an equivalent effect is obtained when it has at least one unsaturated hydrocarbon group and the carbon number is equal to or more than 2. Also, Examples in which an isopropyl group is used as a saturated hydrocarbon group have been used; however, an equivalent effect is obtained when it is a tertiary butyl group or the like.

EXAMPLES 5 TO 8

In Examples 5 to 8, as source materials for forming an insulating film, a silsesquioxane represented by the chemical formula (20) and a organic cyclosiloxane represented by the chemical formula (1) were used. In each of Examples 5 to 8, n of the organic cyclosiloxane was set to be 3. For Rx(R1) and Ry(R2) in the side chains of the organic cyclosiloxanes, Rx(R1) and Ry(R2) both were set to be a methyl group in Example 5; Rx(R1) was set to be a vinyl group and Ry(R2) was set to be a methyl group in Example 6; Rx(R1) was set to be an isopropyl group and Ry(R2) was set to be a methyl group in Example 7; and Rx(R1) was set to be a vinyl group and Ry(R2) was set to be an isopropyl group in Example 8. For forming the film in each of Examples 5 to 8, a plasma generating apparatus shown in FIG. 6 was used. Then, in each of Examples 5 to 8, respectively into the source material reservoir tank 226a, a liquid source material obtained by mixing the above-described two kinds of source materials in a molar ratio of 3:8 (silsesquioxane being 3 relative to organic cyclosiloxane being 8) was put and enclosed. Here, the silsesquioxane represented by the chemical formula (20) is a solid at an ordinary temperature. For this reason, the organic cyclosiloxane represented by the chemical formula (1) was used as a solvent, and the liquid source material obtained by dissolving the silsesquioxane represented by the chemical formula (20) into this solvent was put and enclosed into the source material reservoir tank 226a.

Figure 5:
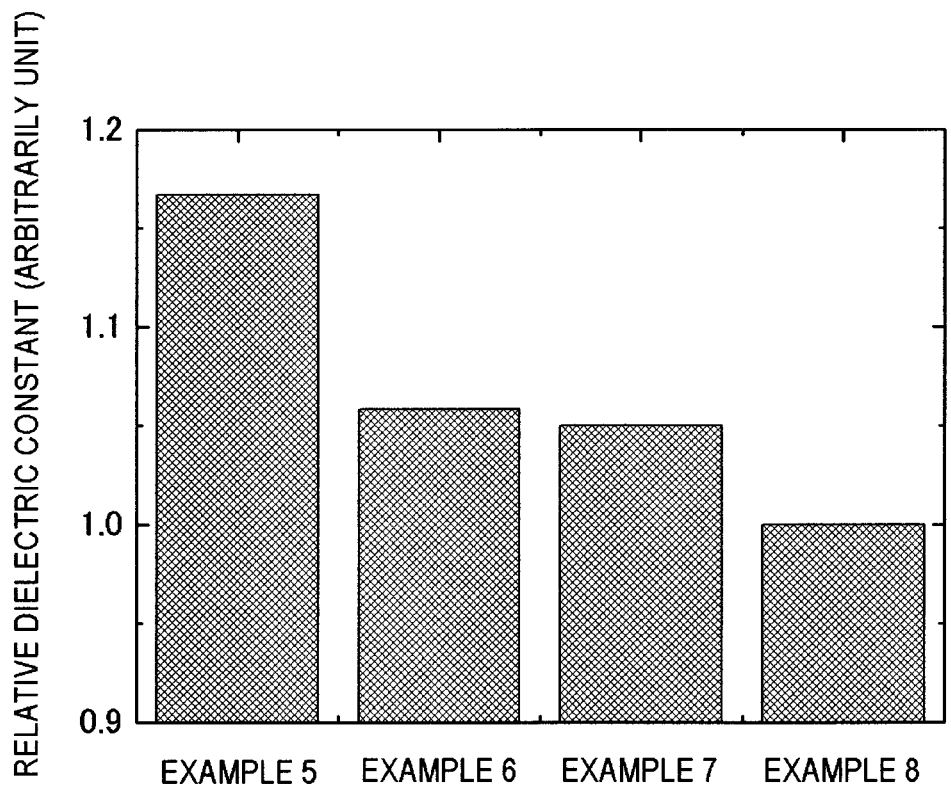
FIG. 5 is a view showing a relationship between the structure of the side chain of organic cyclosiloxane used as a solvent in Examples 5 to 8 and the relative specific dielectric constant.

FIG. 5 is a view showing a relative value of a result of measuring the specific dielectric constant of the formed insulating film in each of Examples 5 to 8. Here, among the structures of the side chains of the organic cyclosiloxanes, the vinyl group is an unsaturated hydrocarbon, and the isopropyl group is a hydrocarbon having a large steric hindrance. From the result shown in FIG. 5, it will be understood that, in the cases (Examples 6 to 8) in which an unsaturated hydrocarbon (vinyl group) or a hydrocarbon having a large steric hindrance (isopropyl group) is present in the side chain of the organic cyclosiloxane source material represented by the chemical formula (1), decrease in the specific dielectric constant can be recognized, and in particular, when both are present in the side chain (Example 8), the specific dielectric constant decreases considerably.

EXAMPLE 9

For forming a porous insulating film, first and second organic cyclosiloxanes respectively represented by the chemical formula (1) were used as source materials. As the first organic cyclosiloxane among these, one in which R1 (Rx) is a vinyl group; R2(Ry) is an isopropyl group; and n=3 (2,4,6-triisopropyl-2,4,6-trivinylcyclotrisiloxane) was used. Also, as the second organic cyclosiloxane, one in which R1 (Rx) is a vinyl group; R2 (Ry) is an isopropyl group; and n=4 (2,4,6,8-tetraisopropyl-2,4,6,8-tetravinylcyclotrisiloxane) was used. This second organic cyclosiloxane has a four-membered ring structure and has a large molecular weight, so that it is liable to be crystallized and could not exist stably alone in a liquid state. The present inventors have found out that the second organic cyclosiloxane having a four-membered ring structure can exist stably in a liquid state by dissolving it using the first organic cyclosiloxane having a three-membered ring structure as a solvent, that is, a novel phenomenon such as stabilization of source materials by mixing the three-membered-ring vinylsiloxane and four-membered-ring vinylsiloxane.

Here, some of the organic cyclosiloxanes having a four-membered ring structure are stable in a liquid state, and those that are liable to be crystallized (those that hardly exist stably in a liquid state) are source materials having a bulky side chain and having a large molecular weight. Here, the state of "having a bulky side chain" may be, for example, a state in which x in the chemical composition $C_xH_y$ is equal to or more than 3 per one Si atom (here, x and y are each an arbitrary positive number).

For forming the film in Example 9, a plasma generating apparatus shown in FIG. 6 was used. Into the source material reservoir tank 226a, a liquid source material obtained by mixing these two kinds of source materials in a molar ratio of 4:3 (first organic cyclosiloxane being 4 relative to second organic cyclosiloxane being 3) was put and enclosed. As a carrier gas, He of 400 to 1000 sccm was introduced into the vaporizer 216a via the gas mass flow controller 218a. The film was formed to a film thickness of 100 nm on a p-type silicon substrate of 300 mmφ and having a resistance of equal to or less than 0.1Ω·cm. Thereafter, the film thickness and the specific dielectric constant of the formed porous insulating film were measured by using an ellipsometer and an Hg prober, respectively.

In this manner, in Example 9, two kinds of organic siloxane compound materials are mixed and vaporized to produce a vaporized gas; the two kinds of organic siloxane compound materials each have a structure of the chemical formula (1); Rx in these organic siloxane compound materials are identical to each other; Ry in these organic siloxane compound materials are identical to each other; and Rx and Ry are different from each other.

Further, any one of Rx and Ry is an unsaturated hydrocarbon.

More specifically, Rx is a vinyl group and Ry is an isopropyl group.

Further, n of one of the two kinds of organic siloxane compound materials is 3, and n of the other one is 4.

For this reason, among the two kinds of organic siloxane compound materials, the total number of hydrogen atoms in the side chains other than the unsaturated hydrocarbon groups among the side chains of the organic siloxane compound material with n being 4 (the second organic cyclosiloxane) is equal to or more than 24.

Figure 13:
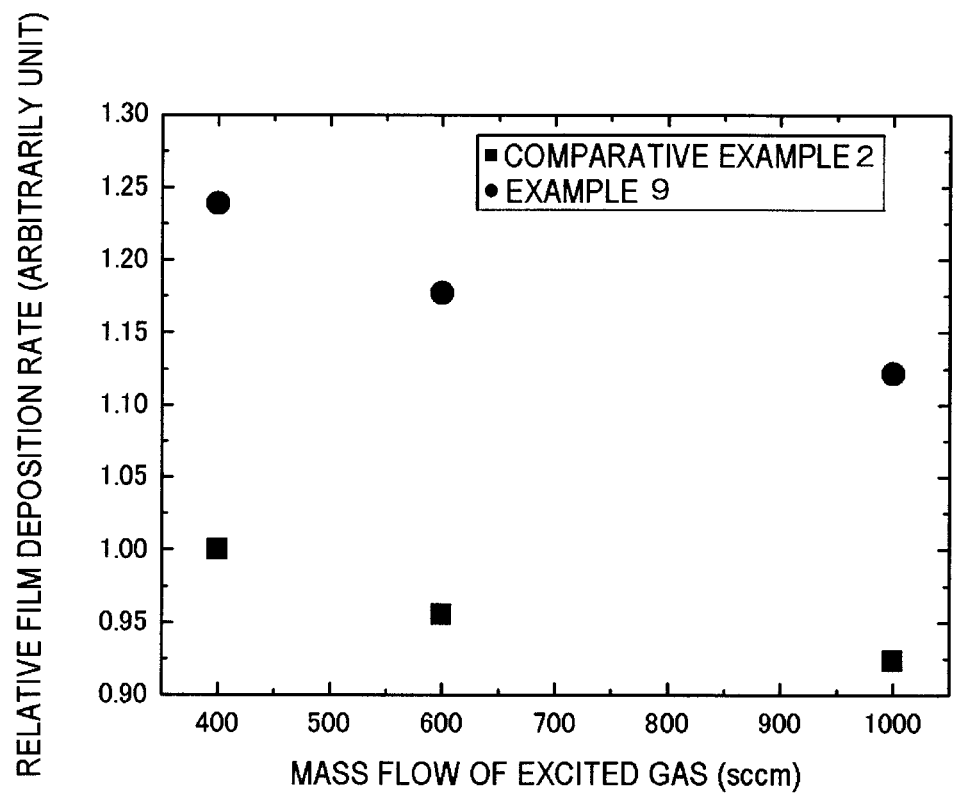
FIG. 13 is a view showing the relative film deposition rate of an insulating film formed in Example 9 and an insulating film formed in Comparative Example 2.

FIG. 13 shows the film deposition rate of the case of Example 9 and the case of Comparative Example 2. In Comparative Example 2, the first organic cyclosiloxane was used singly as a source material.

As shown in FIG. 13, a higher film deposition rate was obtained in Example 9 as compared with Comparative Example 2.

A higher film deposition rate not only raises the throughput of the process but also suppresses the consumption of the source material gases and the carrier gases, whereby a cost reduction can be expected.

As the reason why the film deposition rate is improved in Example 9, the following mechanism can be considered. A polymerization reaction of unsaturated hydrocarbons proceed by ring-opening of double bonds. For this ring-opening, a hydrogen radical is needed. The first organic cyclosiloxane and the second organic cyclosiloxane have bulky side chains such as an isopropyl group attached thereto other than the unsaturated hydrocarbons. Since the bulky side chains such as these contain a lot of hydrogen, they are dissociated in the plasma and generate a lot of hydrogen radicals. It seems that, as a result of this, the ring-opening of the unsaturated hydrocarbon was prompted to allow the polymerization reaction to proceed, thereby improving the film deposition rate.

FIG. 14 shows the film deposition rate of the case of Example 9, the case of Comparative Example 2, and the case of Example 1.

As shown in FIG. 14, a higher film deposition rate was obtained in Example 9 as compared with Comparative Example 2 and Example 1. Also, from the result shown in FIG. 14, it has been found out that the use of a second organic cyclosiloxane having a bulky side chain is more effective for improvement of the film deposition rate.

Figure 15:
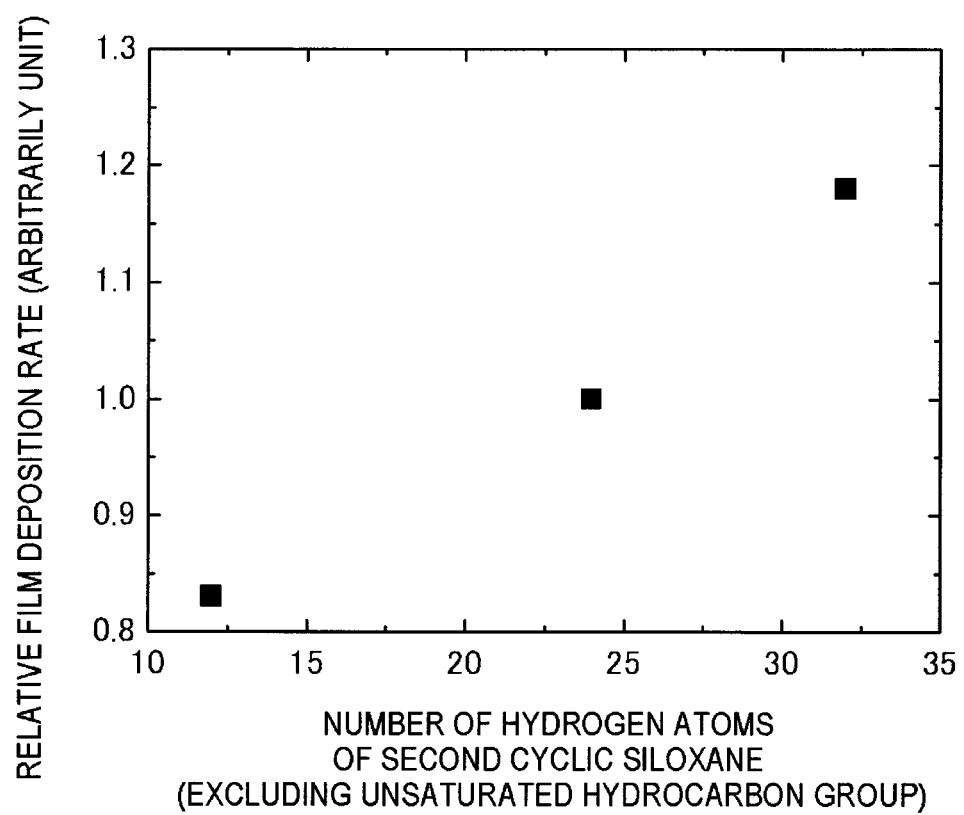
FIG. 15 is a view obtained by plotting the relative film deposition rate along the longitudinal axis with the horizontal axis being the number of hydrogen atoms in a side chain excluding unsaturated hydrocarbon groups of a second organic cyclosiloxane serving as a source material.

FIG. 15 is a view obtained by plotting the film deposition rate along the longitudinal axis with the horizontal axis representing the number of hydrogen atoms in the side chain excluding the unsaturated hydrocarbon groups of the second organic cyclosiloxane.

As shown in FIG. 15, according as the number of hydrogen atoms in the side chain excluding the unsaturated hydrocarbon groups of the second organic cyclosiloxane increases, the film deposition rate tends to be improved to a greater extent.

Figure 16:
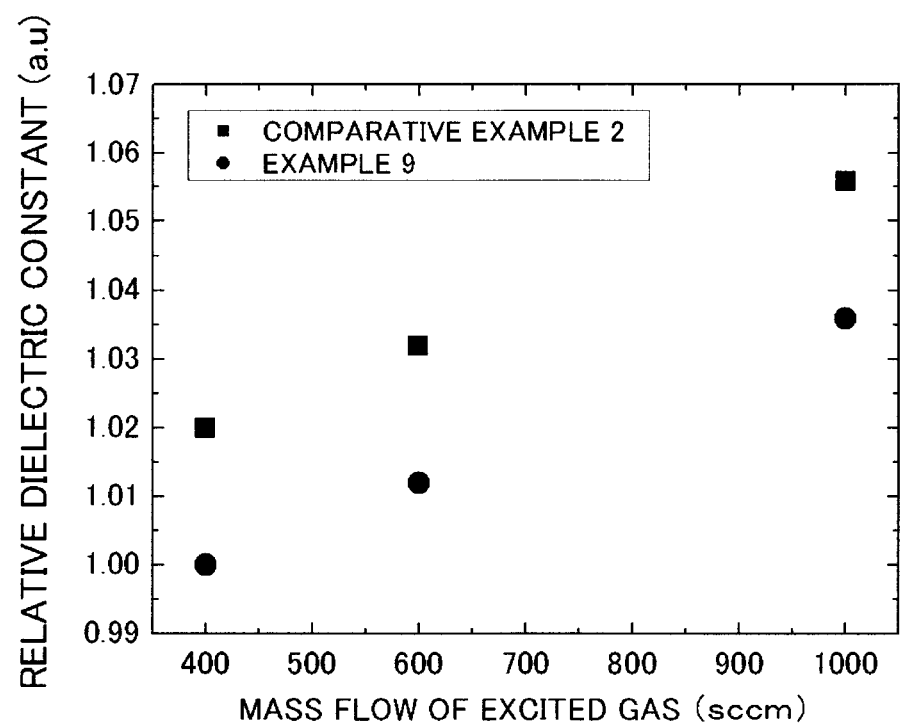
FIG. 16 is a view showing the specific dielectric constant of an insulating film formed in each of Example 9 and Comparative Example 2.

FIG. 16 shows a result of measuring the specific dielectric constant of the film formed respectively in Example 9 and in Comparative Example 2. As shown in FIG. 16, when the film was formed under the same condition, the source material of Example 9 gave a lower dielectric constant as compared with the case of Comparative Example 2. As the reason therefor, the following mechanism can be considered. The main skeleton of the second organic cyclosiloxane is formed of a four-membered ring of Si—O and thus has a larger diameter of the ring as compared with the first organic cyclosiloxane having a three-membered ring of Si—O as a main skeleton. This structure is incorporated into the film itself, whereby pores having a larger diameter can be introduced as compared with the case (Comparative Example 2) in which the film is formed using only the first organic cyclosiloxane as a source material. As a result of this, the lower dielectric constant has been realized. In order that the main skeleton of the organic cyclosiloxane may be incorporated into the film, dissociation of the main skeleton structure in the plasma must be suppressed. By the presence of bulky side chains, the electrons or ions can be suppressed from colliding onto the main skeleton in the plasma. As a result of this, dissociation of the main skeleton structure in the plasma can be suppressed. Therefore, having a bulky side chain is advantageous in this respect as well.

Figure 17:
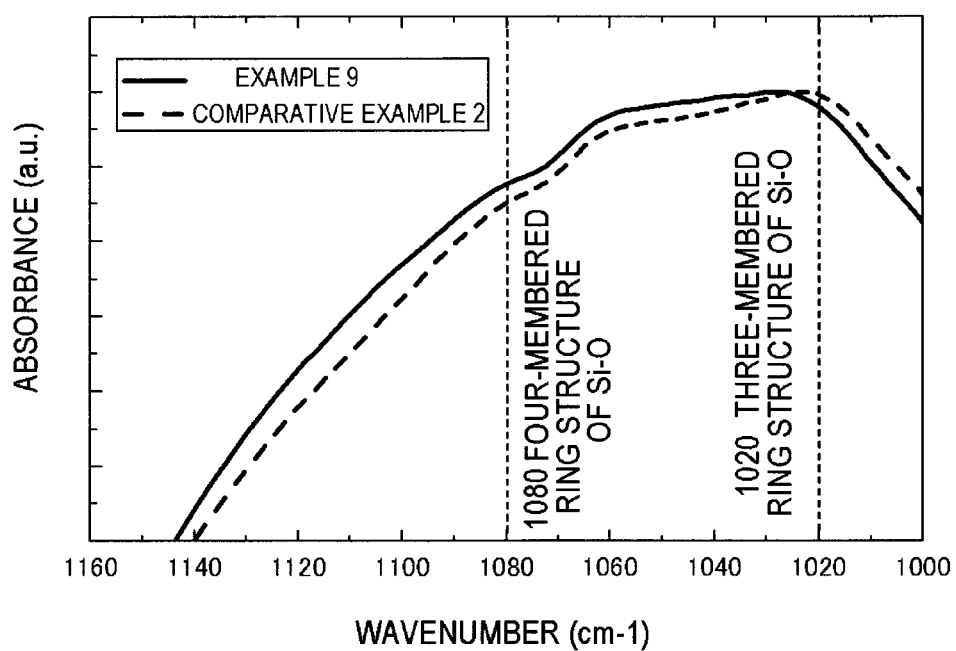
FIG. 17 is a view showing a result obtained by analyzing the absorption peak of an insulating film formed in Example 9 by FTIR.

A film structure analysis was carried out using an FTIR (Fourier Transform Infrared Spectrometer) on the film formed in Example 9. FIG. 17 shows an absorption peak by the Si—O—Si bond in the film. From the result shown in FIG. 17, it will be understood that the three-membered ring structure of Si—O which is a main skeleton of the first organic cyclosiloxane and the four-membered ring structure of Si—O which is a main skeleton of the second organic cyclosiloxane are contained. Regarding the pore diameter in the film, the pore diameter deriving from the four-membered ring structure of Si—O is larger than the pore diameter deriving from the three-membered ring structure of Si—O. Therefore, since the four-membered ring structure of Si—O can be contained in the film, the pore diameter can be increased, and a lower k value can be realized.

On the other hand, when the film is formed using only the first organic cyclosiloxane as a source material (Comparative Example 2), the three-membered ring structure is larger in amount and the four-membered ring structure is smaller in amount as compared with Example 9. This shows that the three-membered ring structure of Si—O is large in amount in the film. The Comparative Example 2 provides a smaller average pore diameter than Example 9. The reason why the four-membered ring structure of Si—O is recognized in the film formed from the three-membered ring source material of Si—O seems to be because a part of the source material is opened and cleaved at the time when the film is formed, thereby forming a four-membered ring structure; however, the amount thereof is smaller as compared with the Example. Also, when the opening and cleavage proceeds, the hydrocarbon of the side chain is dissociated, and the carbon concentration in the film decreases, thereby raising a fear of increase in the k value.

Figure 18:
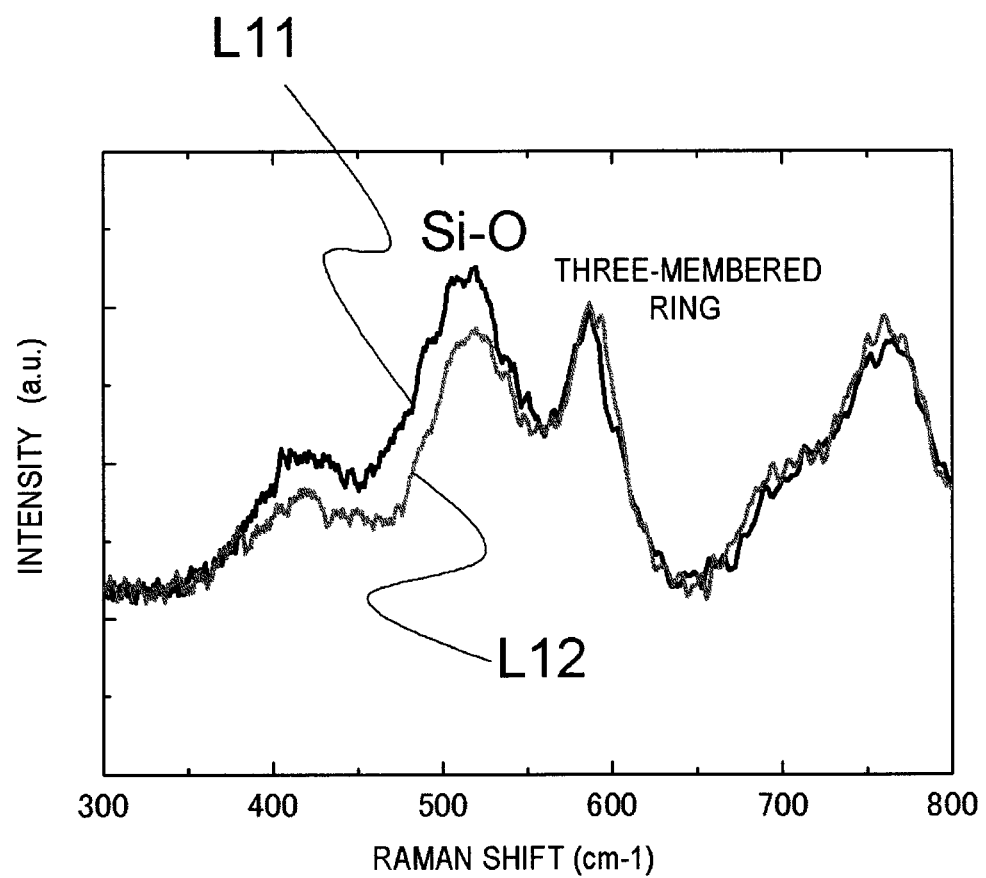
FIG. 18 is a view showing a Raman spectroanalysis result of an insulating film formed in Example 9 and a Raman spectroanalysis result of an insulating film formed in Comparative Example 2.

FIG. 18 shows a Raman spectroanalysis result (curve L11) of the film formed in Example 9 and a Raman spectroanalysis result (curve L12) of the film formed in Comparative Example 2. The peak observed near 500 cm$^{-1}$ is a peak of the chain Si—O structure or the four-membered ring of Si—O. Also, the peak observed near 590 cm$^{-1}$ is a peak of the three-membered ring of Si—O. In FIG. 18, the data of the film of Example 9 and the data of the film of Comparative Example 2 are plotted by equalizing the height of the peak of the three-membered ring of Si—O.

From the result shown in FIG. 18, it has been found out that a larger peak of the chain Si—O structure or the four-membered ring of Si—O (hereafter referred to as Si—O peak) can be recognized in the film formed in Example 9 as compared with the film formed in Comparative Example 2, so that a larger amount of the chain Si—O structure or the four-membered ring of Si—O is contained.

Subsequently, then, a study was made as to whether this Si—O peak is derived from the chain Si—O structure or from the four-membered ring of Si—O. The peak of the four-membered ring of Si—O appears on a lower wavenumber side than the peak of the chain Si—O structure.

Therefore, the position of the Si—O peak near 500 cm$^{-1}$ was investigated in detail for each of the film formed in Example 9 and the film formed in Comparative Example 2.

Figure 19:
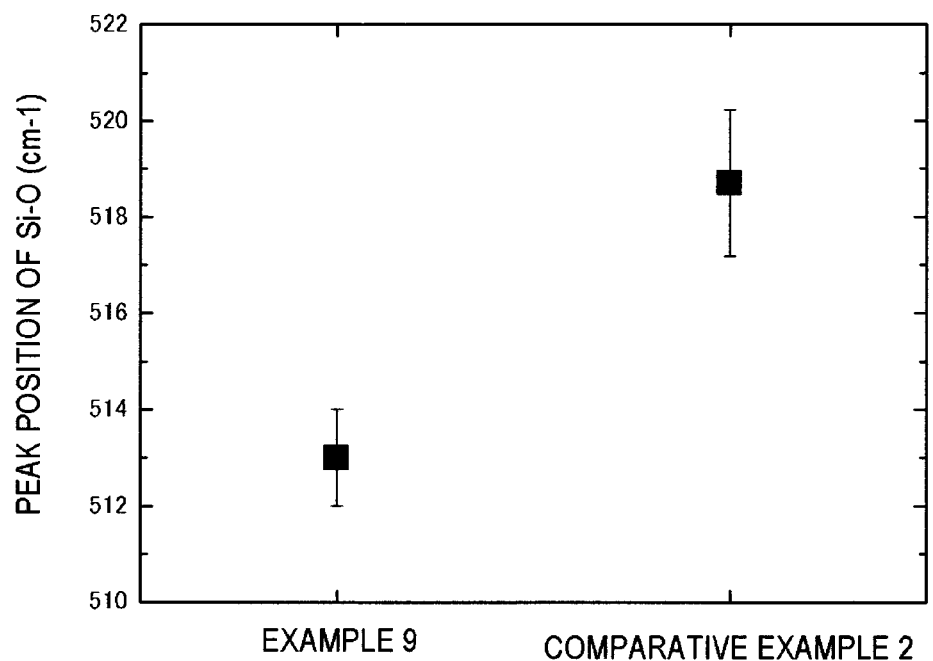
FIG. 19 is a view showing a position of the Si—O peak of an insulating film formed in Example 9 and an insulating film formed in Comparative Example 2.

FIG. 19 shows a position of the Si—O peak for each of the film formed in Example 9 and the film formed in Comparative Example 2. From the result shown in FIG. 19, it has been found out that the peak of the film formed in Example 9 is located on a lower wavenumber side than the peak of the film formed in Comparative Example 2. The reason therefor seems to be because the film formed in Example 9 contains a larger amount of four-membered ring structure of Si—O.

Figure 20:
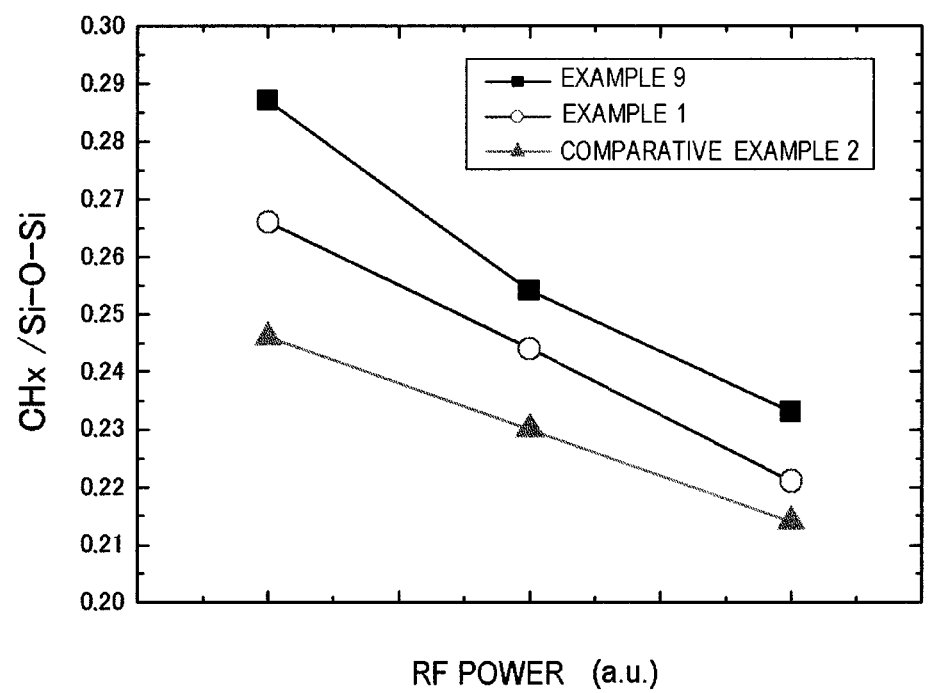
FIG. 20 is a view showing a result obtained by analyzing the ratio of $CH_x$ and Si—O—Si contained in each of an insulating film formed in Example 9, an insulating film formed in Example 1 and an insulating film formed in Comparative Example 2 by the FTIR.

FIG. 20 is a view showing a result obtained by analyzing the ratio of $CH_x$ and Si—O—Si contained in each of an insulating film formed in Example 9, an insulating film formed in Example 1 and an insulating film formed in Comparative Example 2 by the FTIR. The longitudinal axis represents a value obtained as a fraction assuming that the area of the peak of $CH_x$ (the peak observed near 2750 to 3200 $cm^{-1}$) is a numerator and the area of the peak of Si—O—Si (the peak observed near 900 to 1200 $cm^{-1}$) is a denominator in the FTIR analysis result. According as the value of the longitudinal axis of FIG. 20 is larger, a larger amount of hydrocarbon is incorporated in the film. According as a larger amount of hydrocarbon is incorporated in the film, a lower k value of the film can be expected. From the result of FIG. 20, it will be understood that a larger amount of hydrocarbon is incorporated in the film of Example 1 than in the film of Comparative Example 2, and that a further larger amount of hydrocarbon is incorporated in the film of Example 9 than in the film of Example 1. Here, according as the RF power during the forming of the film is smaller, a larger amount of hydrocarbon is incorporated in the film.

Figure 21:
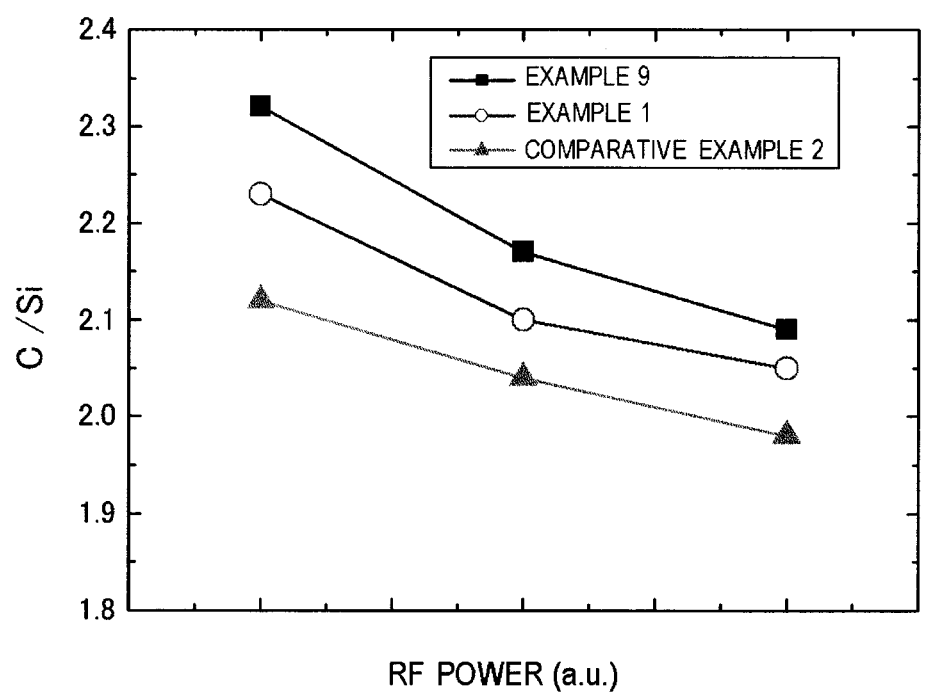
FIG. 21 is a view showing a result obtained by analyzing the ratio of C and Si contained in each of an insulating film formed in Example 9, an insulating film formed in Example 1, and an insulating film formed in Comparative Example 2 by XPS.

FIG. 21 is a view showing a result obtained by analyzing the ratio of C and Si contained in each of an insulating film formed in Example 9, an insulating film formed in Example 1, and an insulating film formed in Comparative Example 2 by the XPS (X-ray Photoelectron Spectroscopy). In this analysis, a bulk analysis was carried out. The longitudinal axis of FIG. 21 is an atomic ratio of C (carbon) and Si (silicon). According as the value of the longitudinal axis of FIG. 21 is larger, a larger amount of hydrocarbon is incorporated in the film. From the result of FIG. 21 also, it will be understood that a larger amount of hydrocarbon is incorporated in the film of Example 1 than in the film of Comparative Example 2, and that a further larger amount of hydrocarbon is incorporated in the film of Example 9 than in the film of Example 1. Also, from the result of FIG. 21 as well, it will be understood that, according as the RF power during the forming of the film is smaller, a larger amount of hydrocarbon is incorporated in the film.

From the analysis results of FTIR and Raman spectroscopy, it seems that the film formed in Example 9 contains a larger amount of four-membered ring structure having a larger ring diameter, thereby realizing a lower k value.

Here, a semiconductor device having a porous insulating film formed in Example 9 or in Example 1 has the following characteristics as one example. That is, this semiconductor device has a multilayer interconnect layer containing a porous insulating film; at least any one layer among this porous insulating film contains plural kinds of Si—O main skeleton structures of organic siloxane in the porous insulating film; and the ratio C/Si of the number of carbon atoms to the number of silicon atoms in the porous insulating film is equal to or more than 2.2 (see the plots with the lowest RF power in FIG. 21).

EXAMPLE 10

For forming a porous insulating film, the same first and second organic cyclosiloxanes as in Example 9 were used as source materials.

Figure 22:
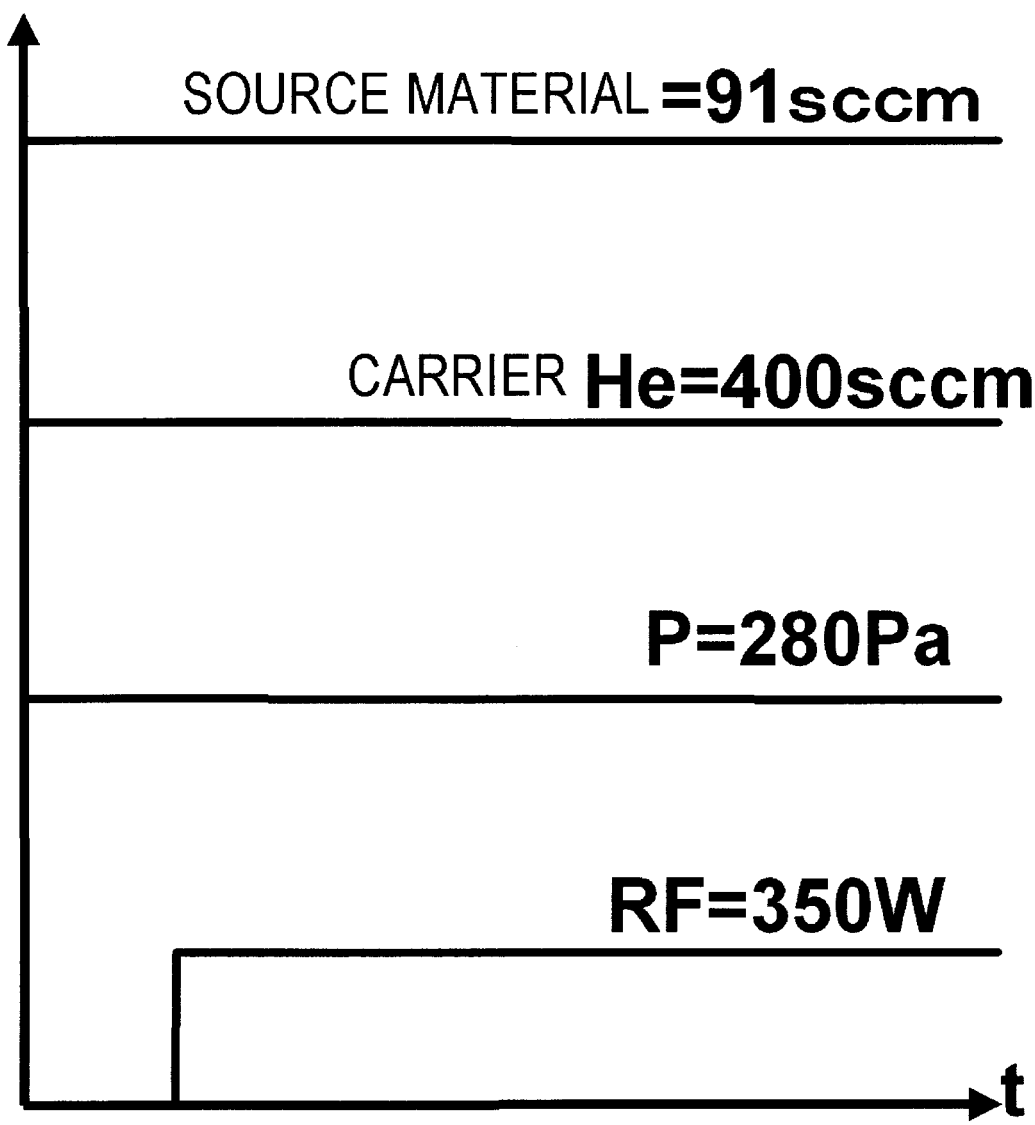
FIG. 22 is a time chart for describing the process of producing an insulating film in Example 10.

For forming the film in Example 10, a plasma generating apparatus shown in FIG. 6 was used. Into the source material reservoir tank 226a, a liquid source material obtained by mixing these two kinds of source materials in a molar ratio of 4:3 (first organic cyclosiloxane being 4 relative to second organic cyclosiloxane being 3) was put and enclosed. As a carrier gas, He was introduced into the vaporizer 216a via the gas mass flow controller 218a. The carrier gas acts as an excited gas. A blanket substrate was formed in advance by laminating a $SiO_2$ film having a film thickness of 180 nm and a SiN film having a film thickness of 45 nm in this order on a p-type silicon substrate with 300 mmϕ, and the film of Example 10 was formed to a film thickness of 200 nm on the blanket substrate. At that time, the film was formed maintaining the mass flow of the vaporized gas of the source material (source material mass flow), the mass flow of the carrier gas (carrier mass flow), and the film deposition pressure (P) to be constant while the RF power was being supplied as shown in the time chart of FIG. 22. Specifically, the RF power was set to be 350 W; the source material mass flow was set to be 91 sccm; the carrier mass flow was set to be 400 sccm; and the film deposition pressure was set to be 280 Pa.

The elastic modulus of the film formed in Example 10 was measured. Also, as Comparative Example 3, a film was formed by the same process as in FIG. 22 using the first organic cyclosiloxane singly as a source material, and the elastic modulus of the obtained film was measured. The measurement of the elastic modulus of Example 10 and Comparative Example 3 was carried out by measuring the close adhesion property using a nanoindenter. The result thereof is shown in FIG. 23.

Figure 23:
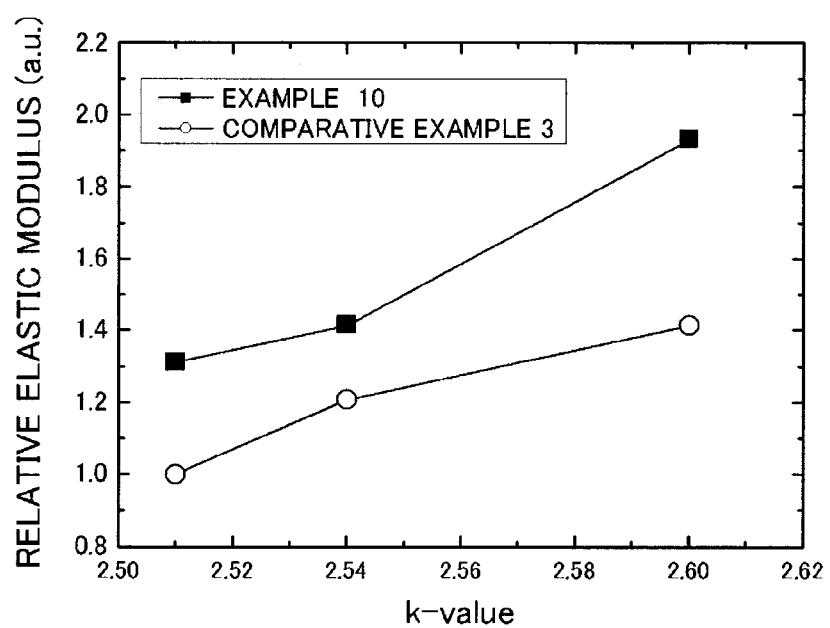
FIG. 23 is a view showing a result of measuring a elastic modulus of an insulating film formed in Example 10 and an insulating film formed in Comparative Example 3.

As shown in FIG. 23, it has been found out that the film formed in Example 10 has a larger elastic modulus than the film formed in Comparative Example 3. This seems to be because the four-membered ring skeleton structure of Si—O which is the second organic cyclosiloxane has a weaker bond than the three-membered ring skeleton structure of Si—O which is the first organic cyclosiloxane, so that the four-membered ring skeleton structure undergoes ring-opening in the plasma, and a phenomenon has occurred such that the Si—O bond of apart of this four-membered ring skeleton structure that has undergone ring-opening bonds the three-membered ring skeleton structures of Si—O with each other.

Here, as shown in FIG. 23, according as the k value is lower, the elastic modulus tends to be weaker; however, for any k value, the film formed in Example 10 had a larger elastic modulus than the film formed in Comparative Example 3.

EXAMPLE 11

Figure 24:
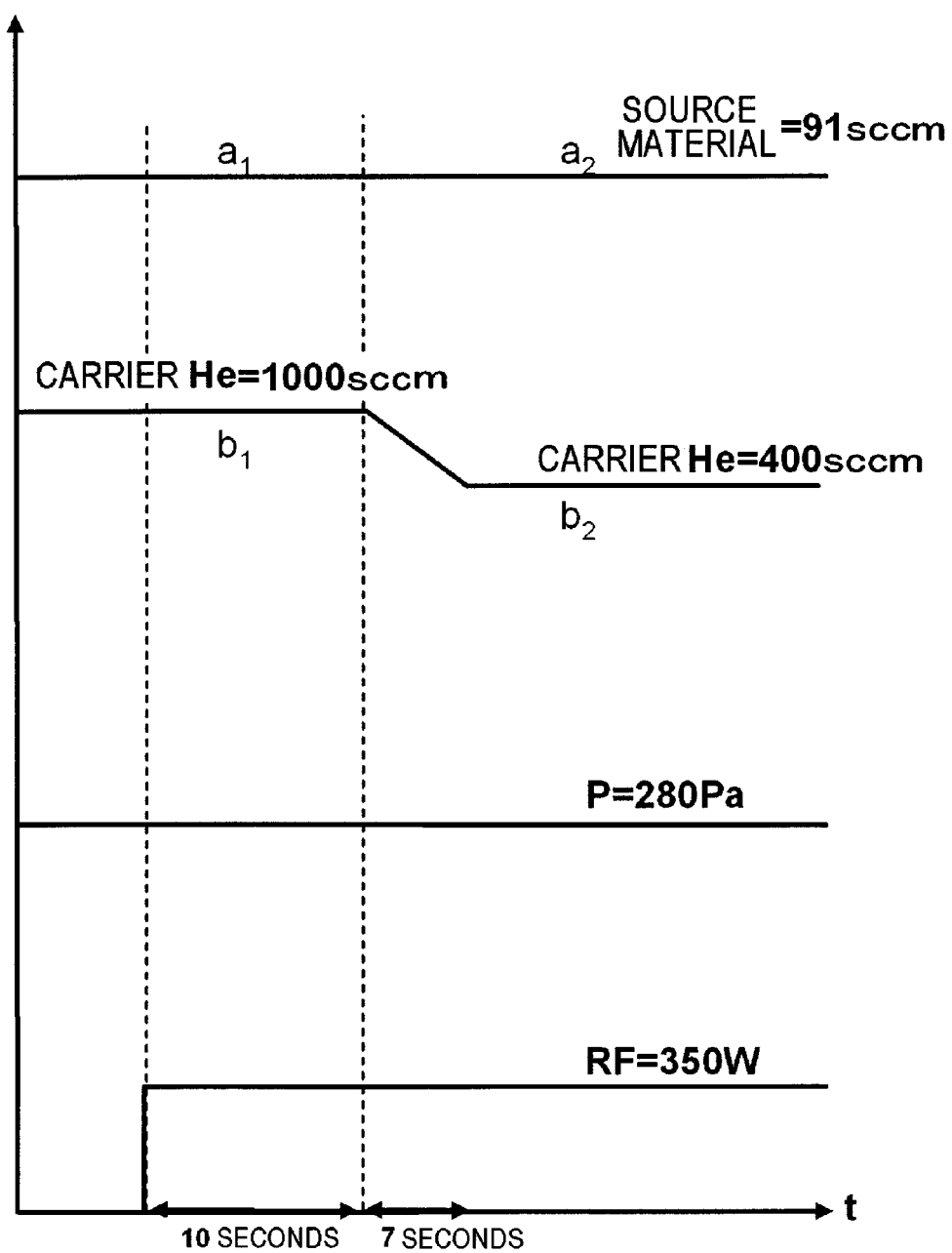
FIG. 24 is a time chart for describing the process of producing an insulating film in Example 11.

A porous insulating film was formed in Example 11 in the same manner as in Example 10, the only difference from Example 10 being in that the carrier mass flow was changed with lapse of time as in the time chart shown in FIG. 24. Namely, in Example 11, as shown in FIG. 24, a method has been adopted such that the excited gas mass flow (carrier gas mass flow) at an initial stage of forming the film was increased to be more than that of Example 10, and thereafter the excited gas mass flow was gradually decreased with lapse of time. Specifically, the excited gas mass flow at the initial stage of forming the film was set to be 1000 sccm, and from the timing at which 10 seconds have passed from the start of energizing the RF power, a step of gradually decreasing (at a constant decreasing speed) the excited gas mass flow for 7 seconds, whereby the excited gas mass flow was decreased to 400 sccm which is the same as that of Example 10.

Namely, in Example 11, the process of forming a porous insulating film includes forming a first porous insulating layer and forming a second porous insulating layer, where an organic siloxane compound material is supplied into a plasma generating apparatus together with a carrier gas, and the organic siloxane compound material is made into a plasma, so as to form the first and second porous insulating layers, and a ratio ($a_2/b_2$) of a gas mass flow ($a_2$) of the organic siloxane compound material relative to a gas mass flow ($b_2$) of the carrier gas in forming the second porous insulating layer is larger than a ratio ($a_1/b_1$) of a gas mass flow ($a_1$) of the organic siloxane compound material relative to a gas mass flow ($b_1$) of the carrier gas in forming the first porous insulating layer.

After the film was formed in Example 11, an epoxy resin was applied to a thickness of 50 μm on the film surface, and the substrate was cut out to 1 cm square (a square with one side being 1 cm) so as to form a sample for measuring the close adhesiveness. The close adhesiveness was evaluated by the m-ELT (modified Edge Liftoff Test) method. Also, a similar evaluation was made on the close adhesiveness of the film obtained in Example 10. The results thereof are shown in FIG. 25.

As shown in FIG. 25, it has been found out that the film formed in Example 11 has a larger close adhesion strength than the film formed in Example 10. This seems to be because the increase in the excited gas mass flow promotes the monomer decomposition, and the hardening of the film proceeds. It is generally said that the elastic modulus and the specific dielectric constant are in a positive correlationship, so that the specific dielectric constant increases according as the elastic modulus increases.

EXAMPLE 12

For forming a porous insulating film, the same first and second organic cyclosiloxanes as in Example 9 were used as source materials.

For forming the film in Example 12, a plasma generating apparatus shown in FIG. 6 was used. Into the source material reservoir tank 226a, a liquid source material obtained by mixing these two kinds of source materials in a molar ratio of 4:3 (first organic cyclosiloxane being 4 relative to second organic cyclosiloxane being 3) was put and enclosed. As a carrier gas, He was introduced into the vaporizer 216a via the gas mass flow controller 218a. The carrier gas acts as an excited gas. The film was formed to have a thickness of 200 nm on a p-type silicon substrate with 300 mmφ. Thereafter, a curing treatment using heat, electron beams, or ultraviolet rays was carried out. In the curing treatment with heat (heat curing), the substrate temperature is preferably set to be 350 degree centigrade or higher. Also, in the curing treatment with electron beams (EB curing), the acceleration energy of the electron beams is preferably set to be 1 to 30 keV, and the dose amount is preferably set to be 0.05 to 1.0 mC/cm$^2$. Also, in the curing treatment with ultraviolet rays (UV curing), the radiation time is preferably set to be 10 seconds to 5 minutes and, for the ultraviolet rays, one arbitrary wavelength or a broadband light source or a combination of these (single wavelength+single wavelength, single wavelength+broadband, broadband+broadband) can be used. Also, the heat curing and the EB curing, or the heat curing and the UV curing can be performed simultaneously. In the present Example, the UV curing was carried out by heating the substrate temperature up to 400 degree centigrade.

In this manner, in Example 12, after the process of forming the porous insulating film, a curing treatment obtained by combining at least any one of the heat curing treatment, the EB curing treatment, and the UV curing treatment is carried out on the porous insulating film. The UV curing treatment is a treatment of radiating ultraviolet rays to the porous insulating film at a substrate temperature of 350 degree centigrade or higher.

Figure 26A:
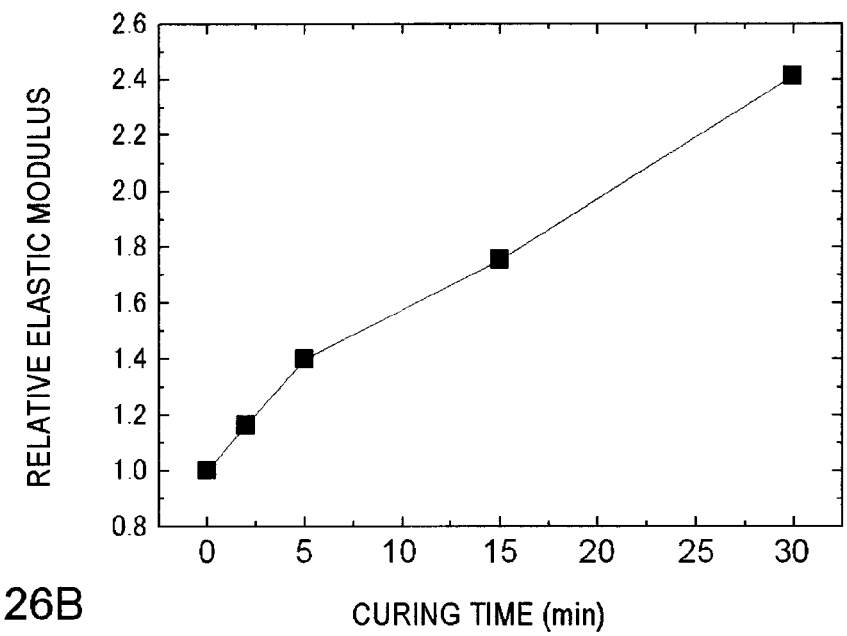
FIGS. 26A and 26B are views showing a relationship between the length of the time for performing the curing treatment, the relative elastic modulus, and the k value.
Figure 26B:
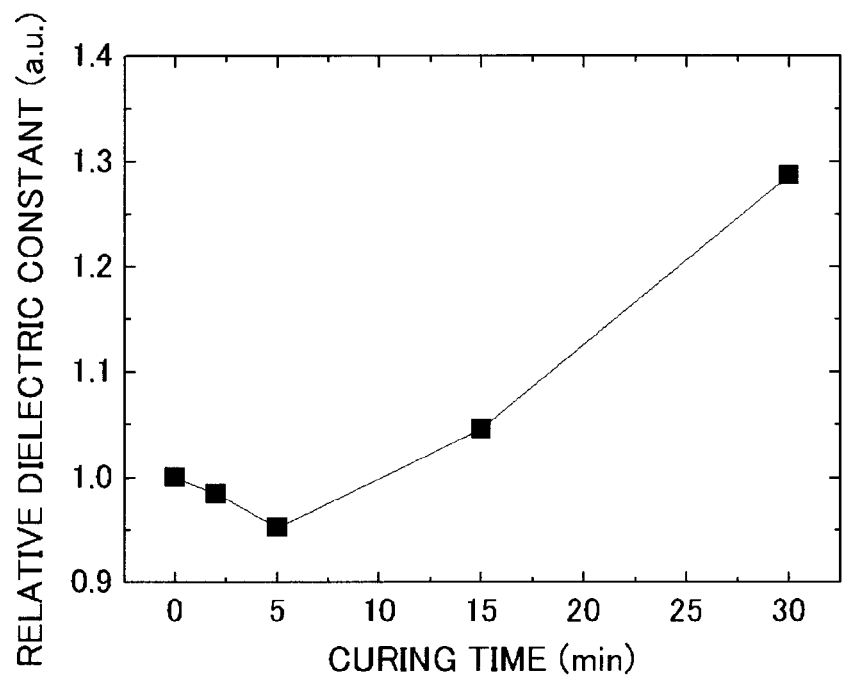

FIG. 26A shows a relationship between the period of time (curing time) during which the curing treatment is carried out and the relative elastic modulus (Modulus). FIG. 26B shows a relationship between the period of time during which the curing treatment is carried out and the k value. From this Figure, it has been found out that, with lapse of the curing time, the k value shows decrease at an initial stage (for example, up to 5 minutes), but thereafter increases. On the other hand, the elastic modulus increases monotonously with lapse of the curing time.

When a film is formed using a source material having a hydrocarbon group in the side chain such as the first organic cyclosiloxane or the second organic cyclosiloxane, the hydrocarbon can be incorporated into the film. It seems that the amount of incorporation is larger according as a bulky hydrocarbon group is attached as a side chain of the source material. Such a hydrocarbon group can cut the bond to eliminate by energy of electron beams or ultraviolet rays. Also, it seems that the formed film surface is terminated by an OH group or the like by adsorption from ambient air. At an initial stage of curing, introduction of pores by elimination of the hydrocarbon group and decrease of the k value by elimination of the OH group are recognized. When the curing is continued, the recombination of Si—O proceeds in accordance with the elimination of the hydrocarbon group, and the increase of the elastic modulus proceeds in accordance with the increase of the k value. In a process using an ordinary curing treatment, a porogen is added in addition to the film source materials at the time of forming the film, and this porogen is eliminated to realize a low k value. However, in the present Example, the k value reduction by elimination of the hydrocarbon group in the side chain can be realized without using a porogen.

In this manner, in Example 12, the treatment time of the UV curing treatment is set to be 10 seconds to 5 minutes. In other words, the treatment time of the UV curing treatment is set to be a period of time such that the elastic modulus of the porous insulating film will be improved as compared with that before the UV curing treatment and the k value of the porous insulating film will be lower than that before the UV curing treatment.

EXAMPLE 13

For forming a porous insulating film, the same first and second organic cyclosiloxanes as in Example 9 were used as source materials.

Figure 27A:
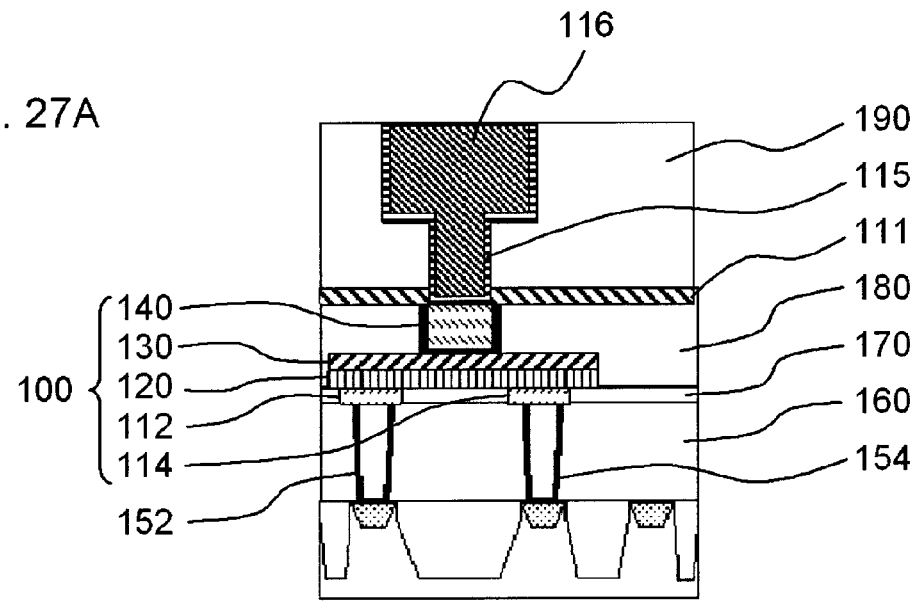
FIGS. 27A and 27B are cross-sectional views of a mixed-mount MRAM.
Figure 27B:
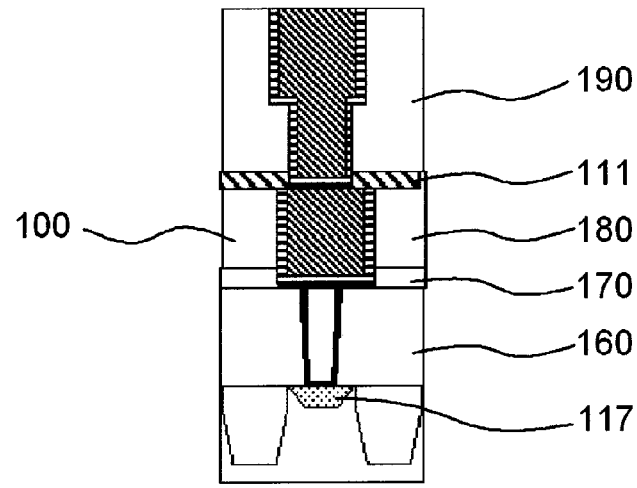

FIGS. 27A and 27B are cross-sectional views of a mixed-mount MRAM (Magnetic Random Access Memory). In the semiconductor device of FIGS. 27A and 27B, an MTJ element (Magnetic Tunnel Junction) 100 (FIG. 27A) and a logic circuit (FIG. 27B) are mounted in a mixed manner.

The MRAM makes determination of 0 or 1 by the magnetization direction of a magnetic substance, thereby operating as a storage element. Generally, there are two modes for inversion of the magnetization of a magnetic substance, that is, the inverted nucleus creation and the magnetic wall movement. The present invention can be applied to both types; however, in the present Example, description will be given by raising an element of magnetic wall movement type as an example.

As shown in FIG. 27A, the mixed-mount MRAM has an MTJ element 100. The MTJ element 100 has a structure such that spin absorption layers 112, 114, a magnetic wall movement layer 120, a tunnel barrier layer 130, and a pin layer 140 are laminated in this order. The lower surfaces of the spin absorption layers 112, 114 are respectively connected to a diffusion layer via contacts 152, 154. The contacts 152, 154 are buried in a porous insulating layer 160. The spin absorption layers 112, 114 are buried in a porous insulating layer 170. The magnetic wall movement layer 120, the tunnel barrier layer 130, and the pin layer 140 are buried in a porous insulating layer 180. An interconnect 111 is formed on the porous insulating layer 180. The upper surface of the pin layer 140 is not covered with the porous insulating layer 180, and is connected to the interconnect 111. On the interconnect 111, a via 115 and an interconnect 116 are formed. The via 115 and the interconnect 116 are buried in a porous insulating layer 190.

Here, as shown in FIG. 27B, a transistor constituting a logic circuit is formed in a logic region. FIG. 27B shows a source-drain region 117 of the transistor.

The hysteresis characteristics of the antiferromagnetic layer were examined for each of a device fabricated by applying a porous insulating film of the present Example and a device fabricated by applying a porous insulating film of the Comparative Example 4 as the porous insulating layers 160, 170, 180, 190 of the mixed-mount MRAM shown in FIGS. 27A and 27B. Here, in Comparative Example 4, a porous insulating layer was formed by introducing pores using a porogen and a curing process in combination.

Figure 28A:
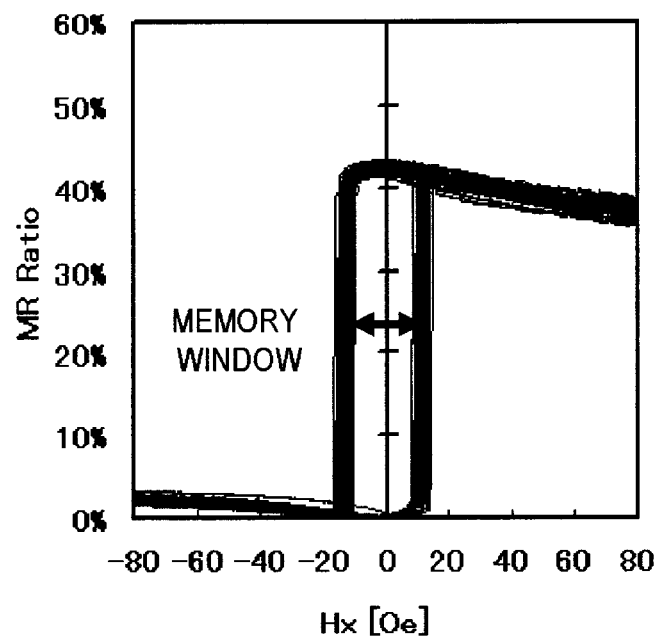
FIGS. 28A and 28B are views showing the hysteresis characteristics of an antiferromagnetic layer of a device (mixed-mount MRAM) using the insulating film of Example 13 and a device using the insulating film of Comparative Example 4.
Figure 28B:
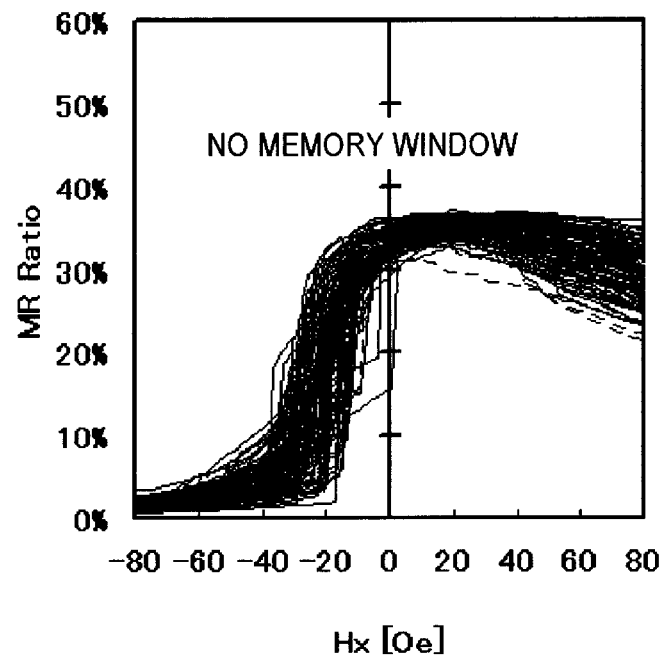

In the present Example, the film deposition temperature is 350 degree centigrade. On the other hand, in the Comparative Example 4, though the film deposition temperature is 350 degree centigrade, heating at 400 degree centigrade is carried out in addition at the time of the curing process. The result thereof is shown in FIGS. 28A and 28B. FIG. 28A shows the result of Example 13, and FIG. 28B shows the result of Comparative Example 4. The horizontal axis in FIGS. 28A and 28B represents a magnetic field, and the longitudinal axis represents a resistance ratio. When the porous insulating film of the present Example is applied, the memory window is retained (two values can be assumed in a certain range (memory window)), so that it can operate as a device. However, it has been found out that, when the porous insulating film of Comparative Example 4 is applied, no memory window is seen, and it is difficult to assume two values, so that it cannot operate as a device.

In the present Example, since the curing process is not carried out, the processing temperature can be set to be 350 degree centigrade or lower. However, in Comparative Example 4, the porous insulating layer passes through a heat history of 400 degree centigrade due to the curing process. It is expected that the MTJ element undergoes the following phenomenon due to the heat treatment of 400 degree centigrade or higher. One phenomenon is that, by the heat treatment, the crystal structure of the antiferromagnetic layer changes and, for this reason, the magnetization direction of the antiferromagnetic layer changes, making it impossible to fix the magnetization direction of the pin layer. The other phenomenon is that, by heat treatment, metal diffusion is generated through the tunnel barrier layer, whereby the magnetization characteristics of the magnetic recordation layer or the pin layer change. By this, when the porous insulating film of Comparative Example 4 is applied, a poor operation of the device seems to have occurred. On the other hand, the porous insulating film of the present Example passes through only a heat history up to 350 degree centigrade, so that the device seems to operate without generating poorness in the MTJ element.

Here, when the source materials of Example 13 are used, the porous insulating film can be grown at a low temperature of 350 degree centigrade or lower, for example, at 200 degree centigrade. By using the source materials of Example 13, the heat load on the MTJ element can be further suppressed. The growth temperature range can be set to be 350 to 25 degree centigrade; however, it is preferably a temperature of 200 degree centigrade or higher and 350 degree centigrade or lower in consideration of the stability of the porous insulating film.

In this manner, in Example 13, the step of forming a porous insulating film is carried out without including a porogen sublimation process and by setting the substrate temperature to be 200 degree centigrade or higher and 350 degree centigrade or lower.

Also, the semiconductor device (device) formed by Example 13 has a multilayer interconnect layer including a porous insulating film, and at least anyone layer among the above porous insulating film is a porous insulating film produced by Example 13. Further, a memory element is formed in the multilayer interconnect layer, and this memory element is the MTJ element 100.

According to the first embodiment such as described above, the dielectric constant of the insulating film can be reduced easily. Hereinafter, the reason therefor will be described.

First, in this production method, the dielectric constant of an insulating film can be reduced by mixing and thereafter vaporizing two or more kinds of organic siloxane compound materials each having a cyclic SiO structure as a main skeleton and having different structures with each other, or alternatively, simultaneously mixing and vaporizing the two or more kinds of organic siloxane compound materials. In other words, pores can be introduced into the insulating film by incorporating the skeleton structure of the cyclic SiO compounds into the insulating film, whereby the specific dielectric constant of the insulating film can be reduced.

Also, by introducing pores into the insulating film by using the skeleton structure of cyclic SiO compounds, the pore diameter can be made as fine as equal to or less than 1 nm (See FIGS. 3 and 4), and the pores can exist as closed pores in the insulating film. As a result of this, an insulating film having a uniform film density distribution can be obtained. For example, with a cyclosiloxane, the pore size can be controlled by changing n of the chemical formula (1), whereby the specific dielectric constant can be controlled. On the other hand, the same applies to silsesquioxane, and the pore size can be controlled by changing m of the chemical formula (17), whereby the specific dielectric constant can be controlled.

Also, in forming an insulating film by using a plurality of liquid source materials, when the plurality of liquid source materials are individually vaporized, the carrier gas will be large in amount. An inert gas is generally used as the carrier gas. However, since the carrier gas acts also as an excited gas in the plasma, so that, according as the carrier gas is larger in amount, decomposition such as dissociation of the side chain of the source materials and the ring-opening of the skeleton structure proceeds. As a result of this, it will be difficult to introduce fine pores into the insulating film, and also the amount of hydrocarbon that is incorporated into the insulating film will decrease, thereby disadvantageously making it difficult to lower the specific dielectric constant of the insulating film.

In contrast, in the present embodiment, instead of individually vaporizing a plurality of source materials, the plurality of source materials are mixed and thereafter vaporized, or alternatively are mixed and vaporized simultaneously, whereby the carrier gas that transports the source materials can be reduced in amount. This can suppress the decomposition of source materials, and can lower the dielectric constant of the insulating film.

Also, since the dielectric constant of the insulating film can be lowered in this manner, the performance of the interconnect can be improved, thereby making it possible to produce a high-speed LSI with low power consumption.

(Second Embodiment)

In the present embodiment also, an insulating film suitable as an insulating film is formed by mixing at least two kinds of cyclic SiO compound materials, thereafter vaporizing the mixture in the same vaporizer, and performing the plasma vapor growth method using this vaporized gas.

Figure 9:
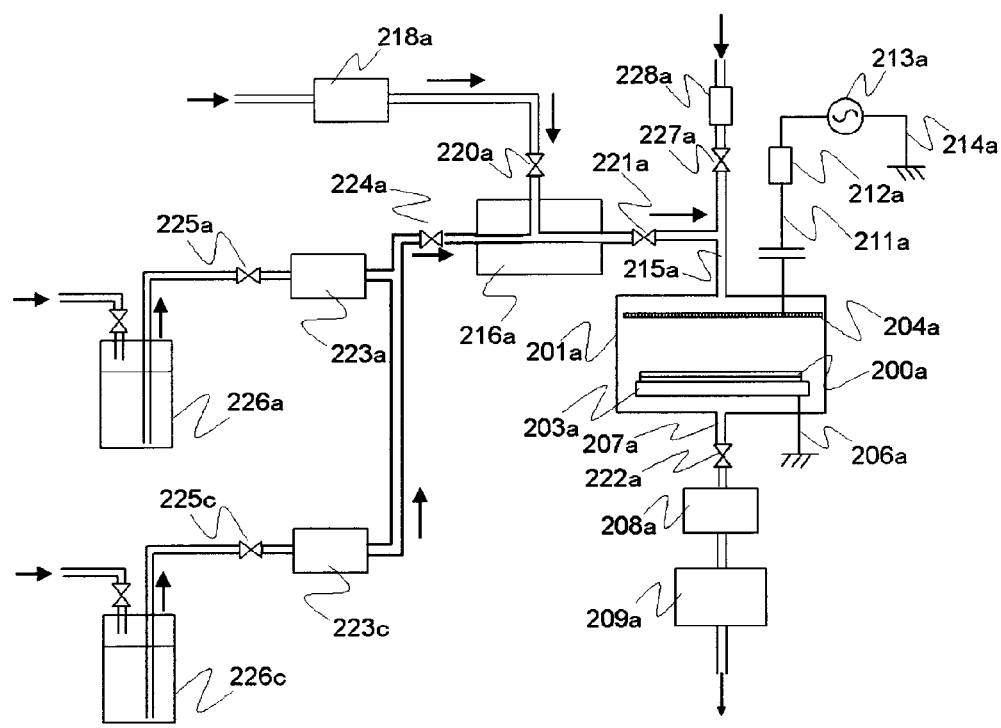
FIG. 9 is a model view showing one example of a plasma generating apparatus used in a method for producing a semiconductor device according to a second embodiment.

FIG. 9 is a model view showing one example of a plasma generating apparatus used in the method for producing a semiconductor device according to the second embodiment.

In the above-described first embodiment, an example has been described in which two or more kinds of cyclic SiO compound materials are put into the same source material reservoir tank 226a. In the second embodiment, an example will be described in which two or more kinds of cyclic SiO compound materials are respectively put into separate source material reservoir tanks 226a, 226c and are mixed immediately before the vaporization. When materials that are mixed in advance are used as in the above-described first embodiment, the mixing ratio cannot be changed after the mixing. However, in the case of the present embodiment, the materials can be mixed each in an arbitrary amount immediately before the vaporization, so that the mixing ratio of the materials can be changed easily. The second embodiment is the same as the first embodiment in other respects. Hereinafter, the difference of the second embodiment from the first embodiment will be described in detail.

In addition to the constituent elements of the plasma generating apparatus shown in FIG. 6, the plasma generating apparatus shown in FIG. 9 further includes a source material reservoir tank 226c, a valve 225c, and a liquid mass flow controller 223c that are respectively similar to the source material reservoir tank 226a, the valve 225a, and the liquid mass flow controller 223a. In the source material reservoir tanks 226a, 226c, cyclic SiO compound materials having different structures from each other are respectively enclosed. The source material enclosed in the source material reservoir tank 226a is press-transported by an inert gas and introduced into the vaporizer 216a via the valve 225a, the liquid mass flow controller 223a, and the valve 224a in this order. Similarly, the source material enclosed in the source material reservoir tank 226c is press-transported by an inert gas and introduced into the vaporizer 216a via the valve 225c, the liquid mass flow controller 223c, and the valve 224a in this order. In other words, the source material in the source material reservoir tank 226a and the source material in the source material reservoir tank 226c are mixed with each other immediately before being supplied to the vaporizer 216a, and are vaporized after the mixing. The place at which these source materials are mixed may be any place as long as the place is located in a pipe between the liquid mass flow controllers 223a and 223c and the vaporizer 216a. The mass flow of the respective source materials are respectively adjusted to desired amounts by the liquid mass flow controllers 223a and 223c. The source materials that are vaporized in the vaporizer 216a are introduced into the chamber 201a together with a carrier gas whose mass flow is adjusted by a liquid mass flow controller 218a.

In this manner, two or more kinds of organic siloxane compound materials are respectively stored in individual vessels, that is, in the source material reservoir tank 226a and in the source material reservoir tank 226c. The two or more kinds of organic siloxane compound materials are mixed with each other after being guided out from the source material reservoir tanks 226a, 226c and, immediately after the mixing, the materials are vaporized to produce a vaporized gas.

EXAMPLE 14

For forming an insulating film, first and second organic cyclosiloxanes were used as source materials. Among these, as the first organic cyclosiloxane, one having the same structure as the first organic cyclosiloxane in Example 1 was used. As the second organic cyclosiloxane, one having the same structure as the second organic cyclosiloxane in Example 1 was used. For forming the film, a plasma generating apparatus shown in FIG. 9 was used. The first organic cyclosiloxane was put and enclosed in the source material reservoir tank 226a, and the second organic cyclosiloxane was put and enclosed in the source material reservoir tank 226c. Further, the mixing ratio of these two kinds of organic cyclosiloxanes was adjusted to plural kinds by mass flow adjustment using the liquid mass flow controllers 223a, 223c, and an insulating film was formed at each mixing ratio.

Figure 7:
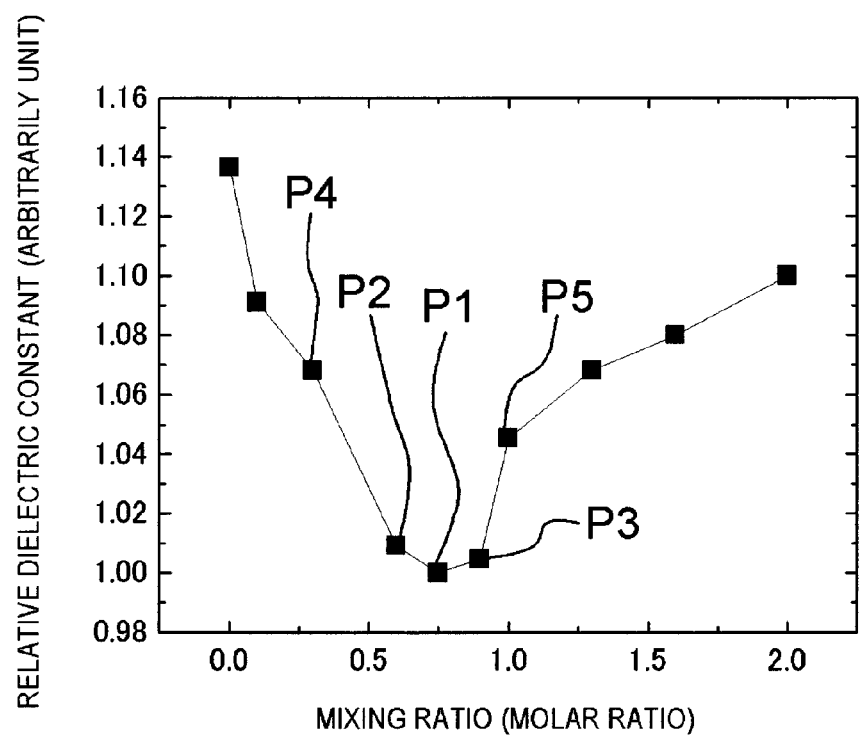
FIG. 7 is a view showing a relationship between a mixing ratio of source materials in Example 14 and the relative specific dielectric constant.

FIG. 7 is a view showing a relationship between a mixing ratio of the two kinds of cyclosiloxanes in Example 14 and the specific dielectric constant of the formed insulating film. The mixing ratio is a value obtained by dividing the molar number of the first organic cyclosiloxane by the molar number of the second organic cyclosiloxane. In FIG. 7, the point P1 is a point obtained by plotting the data when the mixing ratio is set to be ¾ (=0.75); the point P2 is a point obtained by plotting the data when the mixing ratio is set to be 0.75×0.75=0.5625; and the point P3 is a point obtained by plotting the data when the mixing ratio is set to be 0.75×1.25=0.9375. As shown in FIG. 7, the lowest specific dielectric constant could be obtained by setting the mixing ratio (molar ratio) so that the ratio of the second organic cyclosiloxane relative to the first organic cyclosiloxane being assumed to be 1 will be within a range of plus or minus 25% with ¾ being a center. Namely, at the points P1, P2, P3, a specific dielectric constant considerably lower than that of the peripheral points P4, P5 could be achieved. Here, at the points further peripheral to the points P4, P5, the specific dielectric constant is further higher than that of the points P4, P5.

EXAMPLE 15

For forming an insulating film, first and second organic cyclosiloxanes respectively represented by the chemical formula (1) were used as source materials. As the first organic cyclosiloxane among these, one in which R1 (Rx) and R2(Ry) are each a methyl group and n=2 (tetramethylcyclodisiloxane) was used. Also, as the second organic cyclosiloxane, one in which R1 (Rx) is a vinyl group; R2(Ry) is a methyl group; and n=5 (2,4,6,8,10-pentavinyl-2,4,6,8,10-pentamethylcyclopentasiloxane) was used. For forming the film, a plasma generating apparatus shown in FIG. 9 was used. The first organic cyclosiloxane was put and enclosed in the source material reservoir tank 226a, and the second organic cyclosiloxane was put and enclosed in the source material reservoir tank 226c. Further, the mixing ratio of these two kinds of organic cyclosiloxanes was adjusted to plural kinds by mass flow adjustment using the liquid mass flow controllers 223a, 223c, and an insulating film was formed at each mixing ratio.

Figure 8:
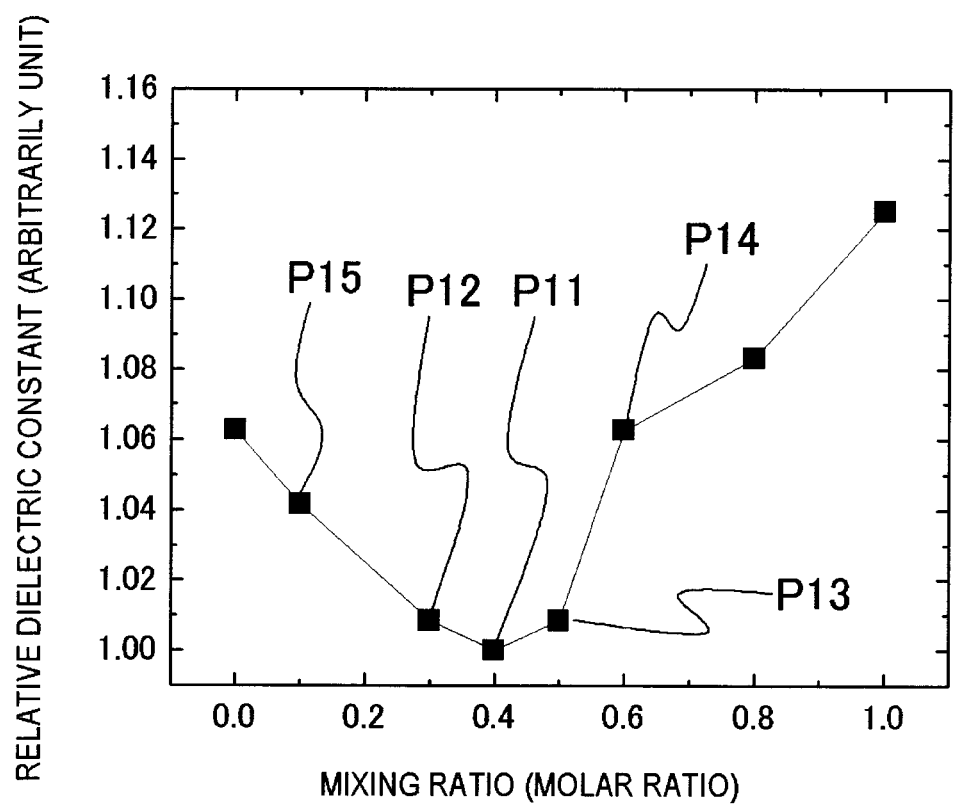
FIG. 8 is a view showing a relationship between a mixing ratio of source materials in Example 15 and the relative specific dielectric constant.

FIG. 8 is a view showing a relationship between a mixing ratio of the two kinds of cyclosiloxanes in Example 15 and the specific dielectric constant of the formed insulating film. The mixing ratio is a value obtained by dividing the molar number of the first organic cyclosiloxane by the molar number of the second organic cyclosiloxane. In FIG. 8, the point P11 is a point obtained by plotting the data when the mixing ratio is set to be ⅖ (=0.4); the point P12 is a point obtained by plotting the data when the mixing ratio is set to be 0.4×0.75=0.3; and the point P13 is a point obtained by plotting the data when the mixing ratio is set to be 0.4×1.25=0.5. As shown in FIG. 8, the lowest specific dielectric constant could be obtained by setting the mixing ratio (molar ratio) so that the ratio of the second organic cyclosiloxane relative to the first organic cyclosiloxane being assumed to be 1 will be within a range of plus or minus 25% with ⅖ being a center. Namely, at the points P11, P12, P13, a specific dielectric constant considerably lower than that of the peripheral points P14, P15 could be achieved. Here, at the points further peripheral to the points P14, P15, the specific dielectric constant is further higher than that of the points P14, P15.

According to the second embodiment as described above, an effect similar to that of the first embodiment can be obtained.

(Third Embodiment)

In the third embodiment, a concrete application example of the method for producing a semiconductor device according to the above first and second embodiments will be described.

FIGS. 10A to 10H are cross-sectional views showing a series of steps in one example of the method for producing a semiconductor device according to the third embodiment.

Figure 10A:
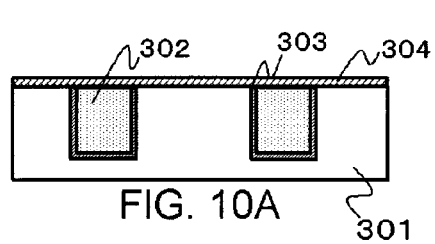
FIGS. 10A to 10H are views showing an example of a method for producing a semiconductor device according to a third embodiment.

First, as shown in FIG. 10A, an insulating interlayer 301, a barrier metal layer 303, a lower layer interconnect 302, and a barrier insulating layer 304 are formed. These insulating interlayer 301, barrier metal layer 303, lower layer interconnect 302, and barrier insulating layer 304 can be formed in the same manner as the insulating interlayer 306, barrier metal layer 308, upper layer interconnect 311, and barrier insulating layer 310 described in the following.

Figure 10E:
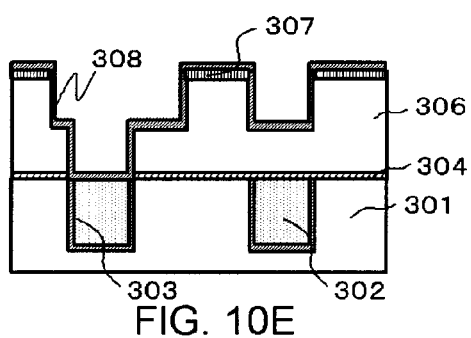
Figure 10B:
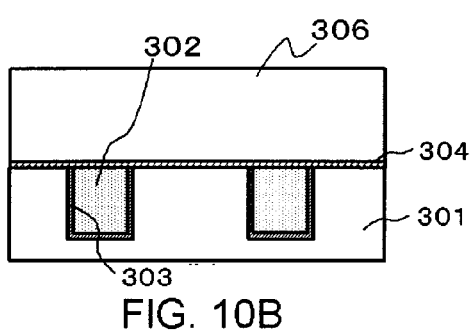

Subsequently, as shown in FIG. 10B, the insulating interlayer 306 is formed on the barrier insulating layer 304 by the method for forming an insulating film described in the first and second embodiments.

Figure 10F:
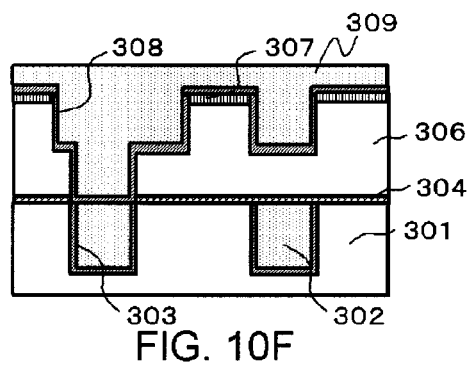
Figure 10C:
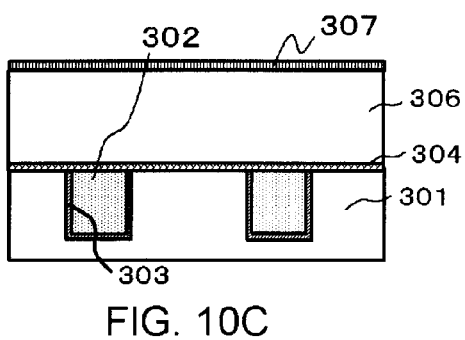

Subsequently, as shown in FIG. 10C, a hard mask layer 307 that will function as a protective film of the insulating interlayer 306 in carrying out CMP (Chemical Mechanical Polish) in a later step is formed on the insulating interlayer 306. The hard mask layer 307 can be, for example, an $SiO_2$ layer, a TEOS layer, a comparatively hard (having a Modulus of equal to or more than 10 GPa) SiOC layer or SiOCH layer.

Figure 10G:
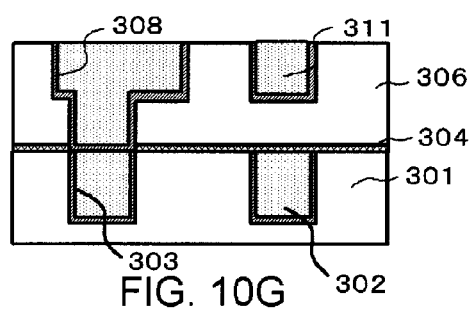
Figure 10D:
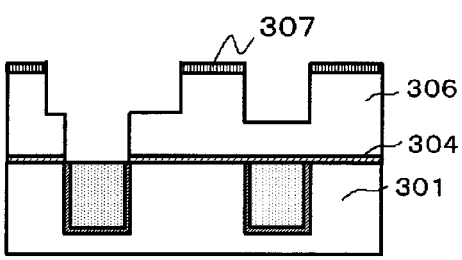

Subsequently, as shown in FIG. 10D, an interconnect trench and an interconnect hole are formed in the insulating interlayer 306 by photolithography and anisotropic etching.

Subsequently, as shown in FIG. 10E, thereafter the barrier metal layer 308 is formed. The barrier metal layer 308 is an electrically conductive layer formed so as to cover the side surface and the bottom surface of the interconnect. The barrier metal layer 308 has a barrier property that suppresses the metal elements constituting the interconnect from being diffused to the insulating interlayer 306 or to lower layers. For example, when the interconnect is formed of a metal element containing Cu as a major component, the barrier metal layer 308 can be, for example, a high-melting-point metal or a nitride thereof such as tantalum (Ta), tantalum nitride (TaN), titanium nitride (TiN), or tungsten carbonitride (WCN), or a laminate layer thereof.

Subsequently, as shown in FIG. 10F, a metal interconnect material 309 is buried into the interconnect trench and the interconnect hole. The metal interconnect material 309 contains, for example, Cu as a major component. Here, in order to improve the reliability of the metal interconnect material 309, the metal interconnect material 309 may contain a metal element other than Cu, or alternatively, a metal element other than Cu may be formed on the upper surface or the side surface of Cu that constitutes the metal interconnect material 309.

Subsequently, a heat treatment is carried out to grow Cu grains. The temperature for this heat treatment is set to be, for example, 200 to 400 degree centigrade, and the time is set to be 30 seconds to one hour.

Subsequently, as shown in FIG. 10G, extraneous metal interconnect material 309, barrier metal 308, and hard mask layer 307 other than the interconnect trench and the interconnect hole are removed by using a polishing technique such as CMP, so as to form an upper layer interconnect 311.

Figure 10H:
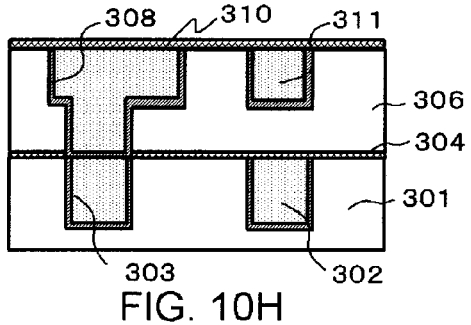

Subsequently, as shown in FIG. 10H, a barrier insulating layer 310 is formed on the upper layer interconnect 311, on the insulating interlayer 306, and on the barrier metal layer 308. The barrier insulating layer 310 not only has a function of suppressing the oxidation of the upper layer interconnect 311 which is a Cu interconnect and a function of preventing diffusion of Cu into the insulating interlayer 306 but also functions as an etching stop layer at the time of processing an insulating inter layer (not illustrated) formed on the barrier insulating layer 310. The barrier insulating layer 310 can be constructed, for example, with an SiC layer, an SiCN layer, an SiN layer, a CoWP layer, a CoWB layer, a CoSnP layer, a CoSnB layer, a NiB layer, a NiMoB layer, or the like.

Thereafter, the steps from FIGS. 10B to 10H are repeated for a desired number of times, whereby a multilayer interconnect layer having a desired layer structure can be formed. Here, an example has been described in which the first and second embodiments are applied to the dual damascene method that forms an interconnect trench and an interconnect hole at the same time. However, the first and second embodiments can be applied also for forming an interconnect layer when the single damascene method is employed.

Figure 11A:
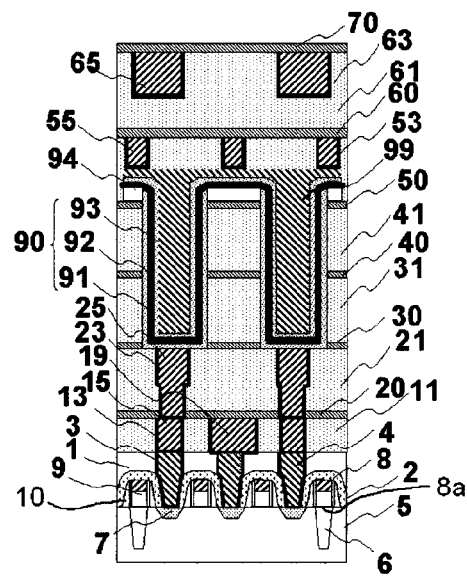
FIGS. 11A to 11C are views showing an example of the semiconductor device produced by the method for producing a semiconductor device according to the third embodiment.
Figure 11B:
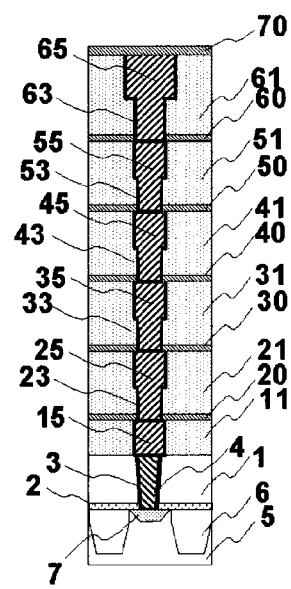
Figure 11C:
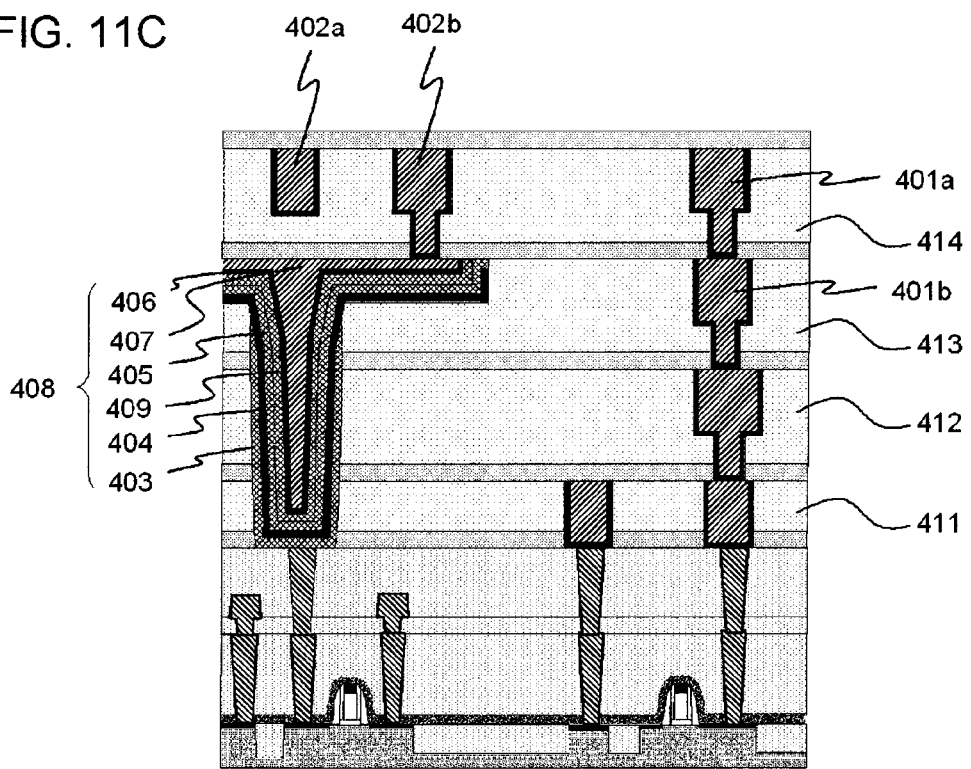

FIGS. 11A to 11C are cross-sectional views showing an example of a semiconductor device produced by such a production method. FIG. 11A shows a DRAM (Dynamic Random Access Memory) cell part of this semiconductor device, and FIG. 11B shows a logic part of this semiconductor device. Also, as another example of DRAM, a cross-sectional structure such as shown in FIG. 11C can be assumed as well.

First, a structure of the DRAM cell part will be described. As shown in FIG. 11A, the DRAM cell part has a MOS transistor 9 formed on a silicon substrate 5 that has been subjected to element isolation by an isolation film 6 such as an STI (Shallow Trench Isolation). This MOS transistor 9 has a diffusion layer 7 formed on the silicon substrate 5, a gate electrode 8 formed on the silicon substrate 5 via a gate insulating layer 8a, and a sidewall 10. Each MOS transistor 9 is covered by a contact insulating interlayer 1 via an etching stop layer 2. In the contact insulating interlayer 1, a contact plug 4 that is in contact with the diffusion layer 7 is formed with a contact barrier metal layer 3 serving as a liner.

On the contact insulating interlayer 1, an insulating interlayer 11 of a first layer is formed. In this insulating interlayer 11, a first layer interconnect 19 functioning as a bit line is formed with the first layer interconnect barrier metal layer 13 serving as a liner. On the insulating interlayer 11, an insulating interlayer 21 of a second layer is formed. In this insulating interlayer 21, a second layer interconnect 25 is formed with the second layer interconnect barrier metal layer 23 serving as a liner. On the insulating interlayer 21, a cap layer 30 of the second layer interconnect is formed. On this cap layer 30, an insulating interlayer 31 of a third layer is formed. On this insulating interlayer 31, a cap layer 40 of the third layer interconnect is formed. On this cap layer 40, an insulating interlayer 41 of a fourth layer is formed. On this insulating interlayer 41, a cap layer 50 of the fourth layer interconnect is formed. On this cap layer 50, a hard mask insulating layer 94 is formed. Then, in the hole part that penetrates through the hard mask insulating layer 94, the cap layer 50, the insulating interlayer 41, the cap layer 40, the insulating interlayer 31, and the cap layer 30, an in-cylinder-buried metal 99 is formed with a laminate layer obtained by laminating layers of three layers of a lower electrode layer 91, a capacitance insulating layer 92, and an upper electrode layer 93 in this order serving as a liner. A capacitance element 90 is constructed with these in-cylinder-buried metal 99, lower electrode layer 91, capacitance insulating layer 92, and upper electrode layer 93. Here, at the places other than the sites constituting the cylinder capacitance, the hard mask insulating layer 94, the lower electrode layer 91, the capacitance insulating layer 92, and the upper electrode layer 93 are absent on the cap layer 50.

On the in-cylinder-buried metal 99 and on the cap layer 50, an insulating interlayer 51 of the fifth layer is formed. In this insulating interlayer 51, an interconnect trench that reaches the in-cylinder-buried metal 99 is formed. In this interconnect trench, a fifth layer interconnect 55 is formed with the fifth layer interconnect barrier metal layer 53 serving as a liner. On the insulating interlayer 51 and on the fifth layer interconnect 55, a cap layer 60 of the fifth layer interconnect is formed. On this cap layer 60, an insulating interlayer 61 of the sixth layer is formed. In this insulating interlayer 61, a sixth layer interconnect 65 is formed with the sixth layer interconnect barrier metal layer 63 serving as a liner. On the insulating interlayer 61 and on the sixth layer interconnect 65, a cap layer 70 of the sixth layer interconnect is formed.

Next, a structure of the logic part will be described. As shown in FIG. 11B, in the logic part as well, in the same manner as in the DRAM cell part, an isolation film 6 and a diffusion layer 7 are formed on the silicon substrate 5. Then, an etching stop layer 2 is formed on the silicon substrate 5. On this etching stop layer 2, a contact insulating interlayer 1 is formed. In this contact insulating interlayer 1, a hole part that reaches the diffusion layer 7 is formed. In this hole part, a contact plug 4 is formed with the contact barrier metal layer 3 serving as a liner. On the contact plug 4 and on the contact insulating interlayer 1, an insulating interlayer 11 of a first layer is formed. On this insulating interlayer 11, a first layer interconnect 15 functioning as a bit line is formed with the first layer interconnect barrier metal layer 13 serving as a liner.

On the insulating interlayer 11, an insulating interlayer 21 of a second layer is formed. In this insulating interlayer 21, a second layer interconnect 25 is formed with the second layer interconnect barrier metal layer 23 serving as a liner. On the insulating interlayer 21, a cap layer 30 of the second layer interconnect is formed. On the cap layer 30, an insulating interlayer 31 of a third layer is formed. In this insulating interlayer 31, a third layer interconnect 35 is formed with the third layer interconnect barrier metal layer 33 serving as a liner. On the insulating interlayer 31, a cap layer 40 of the third layer interconnect is formed. Similarly, on the cap layer 40, an insulating interlayer 41 of a fourth layer is formed. In this insulating interlayer 41, a fourth layer interconnect 45 is formed with the fourth layer interconnect barrier metal layer 43 serving as a liner. On the insulating interlayer 41, a cap layer 50 of the fourth layer interconnect is formed. Similarly, on the cap layer 50, an insulating interlayer 51 of a fifth layer is formed. In this insulating interlayer 51, a fifth layer interconnect 55 is formed with the fifth layer interconnect barrier metal layer 53 serving as a liner. On the insulating interlayer 51, a cap layer 60 of the fifth layer interconnect is formed. Similarly, on the cap layer 60, an insulating interlayer 61 of a sixth layer is formed. In this insulating interlayer 61, a sixth layer interconnect 65 is formed with the sixth layer interconnect barrier metal layer 63 serving as a liner. On the insulating interlayer 61, a cap layer 70 of the sixth layer interconnect is formed.

In the above, each of the insulating interlayers 11, 21, 31, 41, 51, 61 of the first to sixth layers, for example, can be formed by the method for forming an insulating film described in the first embodiment or in the second embodiment.

In the case of a DRAM having a cross-sectional structure shown in FIG. 11C, a capacitance element 408 constituting a storage circuit has a lower electrode 403, a capacitance insulating layer 404, an upper electrode 405, a hard mask 409, a barrier metal layer 406, and an upper connection interconnect 407. In the layer above the capacitance element 408, an interconnect 402a having a fixed electric potential and a signal interconnect 402b are formed. In the layer above the interconnect 401b located in the same layer as the upper connection interconnect 407 of the capacitance element 408, an interconnect 401a is formed. In this structure as well, each of the insulating interlayers 411, 412, 413, 414 can be formed by the method for forming an insulating film described in the first embodiment or in the second embodiment.

In the above first and second embodiments, an example has been described in which two or more kinds of source materials are mixed before introducing the source materials into the vaporizer 216a. However, two or more kinds of source materials may be introduced into the vaporizer 216a via separate pipes, and these source materials may be mixed in the vaporizer 216a.

Further, in the case of introducing two or more kinds of source materials into the vaporizer 216a via separate pipes and mixing these source materials in the vaporizer 216a, it is preferable as well to perform the mixing of the two or more kinds of source materials in the vaporizer 216a and the vaporization of the source materials in the vaporizer 216a simultaneously (at the same time). For this purpose, for example, the two or more kinds of source materials may be introduced into a vaporizing chamber (not illustrated) within the vaporizer 216a via separate pipes, and the mixing and the vaporization of the source materials may be carried out in the vaporizing chamber simultaneously (at the same time).

Also, in the first and second embodiments, an example has been described in which the object of forming an insulating film is a semiconductor substrate, particularly a silicon substrate (silicon substrate 200a); however, it may be a SOI (Silicon on Insulator) substrate, a TFT (Thin film transistor), a substrate of a liquid crystal display panel, or the like.

It is apparent that the present invention is not limited to the above embodiment, and may be modified and changed without departing from the scope and spirit of the invention.

The present invention includes the following embodiments:

1. A semiconductor device having a multilayer interconnect layer including a porous insulating film, wherein at least one layer among said porous insulating film is a porous insulating film produced by a method for producing a semiconductor device;

said method comprising:

mixing and thereafter vaporizing two or more kinds of organic siloxane compound materials each having a cyclic SiO structure as a main skeleton and having different structures, or alternatively, simultaneously mixing and vaporizing said two or more kinds of organic siloxane compound materials, so as to produce a vaporized gas;

transporting said vaporized gas to a reaction furnace together with a carrier gas; and forming in said reaction furnace a porous insulating film by the plasma CVD method or the plasma polymerization method using said vaporized gas.

2. A semiconductor device having a multilayer interconnect layer including a porous insulating film, wherein at least one layer among said porous insulating film includes plural kinds of Si—O main skeleton structures of organic siloxane in the porous insulating film, and a ratio C/Si of the number of carbon atoms and the number of silicon atoms in said porous insulating film is equal to or more than 2.2.

3. The semiconductor device according to embodiment 2, wherein said porous insulating film includes a three-membered ring structure of Si—O and a four-membered ring structure of Si—O as an Si—O main skeleton structure of organic siloxane.

4. The semiconductor device according to embodiment 1, wherein a memory element is formed in said multilayer interconnect layer.

5. The semiconductor device according to embodiment 4, wherein said memory element is an MTJ element.

6. The semiconductor device according to embodiment 4, wherein said memory element is a capacitance element.

What is claimed is:

1. A method for producing a semiconductor device, comprising:
mixing and thereafter vaporizing two or more kinds of organic siloxane compound materials each having a cyclic SiO structure as a main skeleton and having different structures, or alternatively, simultaneously mixing and vaporizing said two or more kinds of organic siloxane compound materials, so as to produce a vaporized gas;
transporting said vaporized gas to a reaction furnace together with a carrier gas; and
forming in said reaction furnace a porous insulating film by the plasma CVD method or the plasma polymerization method using said vaporized gas,
wherein two kinds of said organic siloxane compound materials are mixed and vaporized to produce said vaporized gas,
among said two kinds of said organic siloxane compound materials, a first source material has X unsaturated hydrocarbon groups, and a second source material has Y (in some cases, X=Y) unsaturated hydrocarbon groups, and
a mixing ratio (molar ratio) of said first and second source materials is set to be such that a ratio of said second source material relative to said first source material being assumed to be 1 is within a range of plus and minus 25% with X/Y being a center.

2. The method according to claim 1, wherein at least one of said organic siloxane compound materials is a cyclosiloxane having a structure of the following chemical formula (1):

[chemical formula 1]

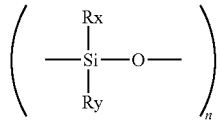
(1)

in the chemical formula (1), n is 2 to 5; each of Rx and Ry is one of a hydrogen atom, an unsaturated hydrocarbon group, and a saturated hydrocarbon group; and each of these unsaturated hydrocarbon groups and saturated hydrocarbon groups is one of vinyl, allyl, methyl, ethyl, propyl, isopropyl, butyl, and tertiary butyl group.

3. The method according to claim 2, wherein
two kinds of said organic siloxane compound materials are mixed and vaporized to produce said vaporized gas, or alternatively two kinds of said organic siloxane compound materials are vaporized and thereafter mixed to produce said vaporized gas;
said two kinds of said organic siloxane compound materials each have the structure of said chemical formula (1);
said Rx of these organic siloxane compound materials are identical to each other;
said Ry of these organic siloxane compound materials are identical to each other; and
said Rx and said Ry are different from each other.

4. The method according to claim 3, wherein any one of said Rx and said Ry is an unsaturated hydrocarbon.

5. The method according to claim 4, wherein said Rx is a vinyl group and said Ry is an isopropyl group.

6. The method according to claim 3, wherein n of one of said two kinds of organic siloxane compound materials is 3, and n of the other is 4.

7. The method according to claim 6, wherein, among said two kinds of organic siloxane compound materials, among the side chains of the organic siloxane compound materials in which n is 4, the total number of hydrogen atoms in the side chains other than an unsaturated hydrocarbon group is equal to or more than 24.

8. The method according to claim 1, wherein
at least one of said organic siloxane compound materials has an unsaturated hydrocarbon group having a carbon number of 2 to 4 and a saturated hydrocarbon group having a carbon number of 1 to 4; and
said unsaturated hydrocarbon group and said saturated hydrocarbon group are bonded to the Si atom that constitutes said cyclic SiO structure.

9. The method according to claim 2, wherein said unsaturated hydrocarbon group is a straight-chain unsaturated hydrocarbon group.

10. The method according to claim 2, wherein said saturated hydrocarbon group is a branched-chain saturated hydrocarbon group.

11. The method according to claim 2, wherein at least one of said organic siloxane compound materials is an organic cyclosiloxane having a structure represented by any one of the following chemical formulas (2), (3), (4), (5), (6), (7), (8), (9), (10), (11), (12), (13), (14), (15), and (16):

[chemical formula 2]

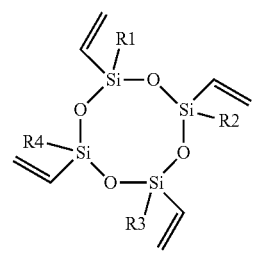
(2)

[chemical formula 3]

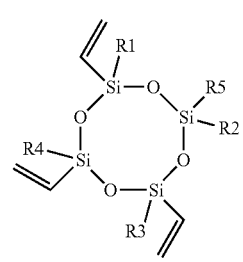
(3)

-continued
[chemical formula 4]
(4)
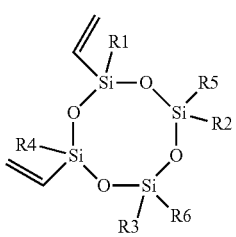
[chemical formula 5]
(5)
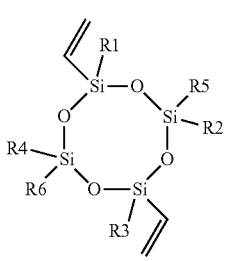
[chemical formula 6]
(6)
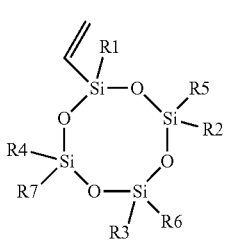
[chemical formula 7]
(7)
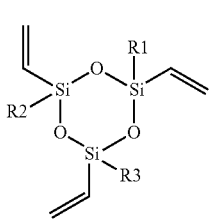
[chemical formula 8]
(8)
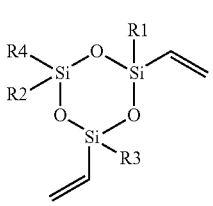
[chemical formula 9]
(9)
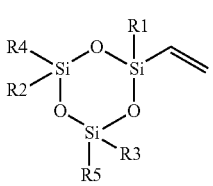
[chemical formula 10]
(10)
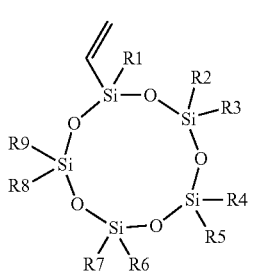
[chemical formula 11]
(11)
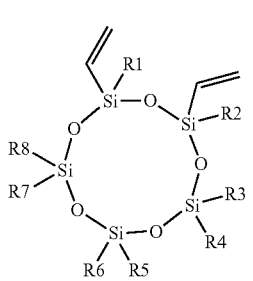
[chemical formula 12]
(12)
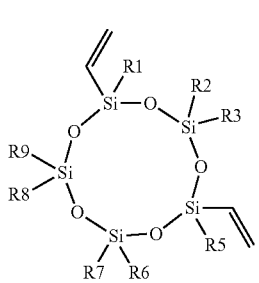
[chemical formula 13]
(13)
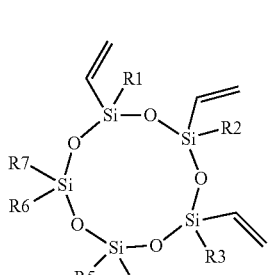
[chemical formula 14]
(14)
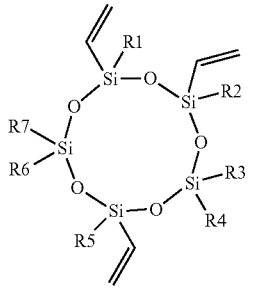

[chemical formula 15]

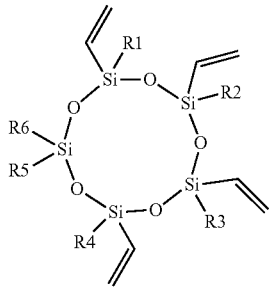

(15)

[chemical formula 16]

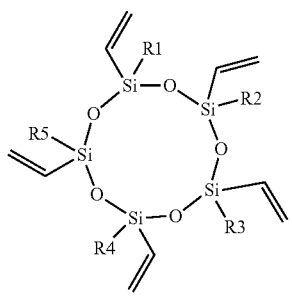

(16)

in the chemical formulas (2) to (16), R1, R2, R3, R4, R5, R6, R7, R8, and R9 are one of a hydrogen atom, an unsaturated hydrocarbon group, and a saturated hydrocarbon group; and each of these unsaturated hydrocarbon groups and saturated hydrocarbon groups is one of vinyl, allyl, methyl, ethyl, propyl, isopropyl, and butyl group.

12. The method according to claim 2, wherein at least one of said organic siloxane compound materials has a structure of said chemical formula (1), where Rx is a vinyl group, Ry is a methyl group, and n is 3 to 5.

13. The method according to claim 2, wherein at least one of said organic siloxane compound materials has a structure of said chemical formula (1), where Rx is a vinyl group, Ry is an isopropyl group, and n is 3 to 5.

14. The method according to claim 2, wherein at least one of said organic siloxane compound materials has a structure of said chemical formula (1), where Rx is a vinyl group, Ry is a tertiary butyl group, and n is 3 to 5.

15. The method according to claim 1, wherein at least one of said organic siloxane compound materials is silsesquioxane having a structure of the following chemical formula (17):

[chemical formula 17]

$(Rz\text{-}SiO_{3/2})_m$ (17)

in the chemical formula (17), m is equal to or more than 4; Rz is one of a hydrogen atom, an unsaturated hydrocarbon group, and a saturated hydrocarbon group; and each of these unsaturated hydrocarbon groups and saturated hydrocarbon groups is one of vinyl, allyl, methyl, ethyl, propyl, isopropyl, and butyl group.

16. The method according to claim 15, wherein at least one of said organic siloxane compound materials is silsesquioxane having a structure represented by any one of the following chemical formulas (18), (19), and (20):

[chemical formula 18]

$(H2C\!\!=\!\!CH\text{-}SiO_{3/2})m$ (18)

[chemical formula 19]

$(CH3\text{-}HC\!\!=\!\!CH\text{-}SiO_{3/2})m$ (19)

[chemical formula 20]

$(H2C\!\!=\!\!CCH3\text{-}SiO_{3/2})m$ (20)

where m is larger than 3 (m>3).

17. The method according to claim 15, wherein at least one of said organic siloxane compound materials is silsesquioxane represented by any one of the following chemical formulas (21), (22), (23), and (24):

[chemical formula 21]

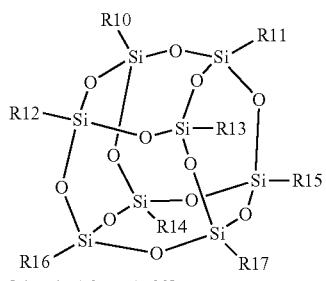

(21)

[chemical formula 22]

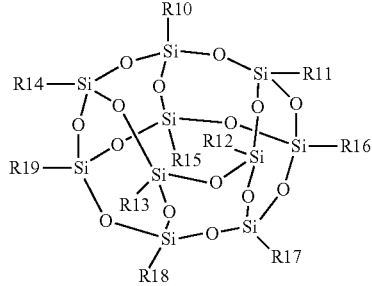

(22)

[chemical formula 23]

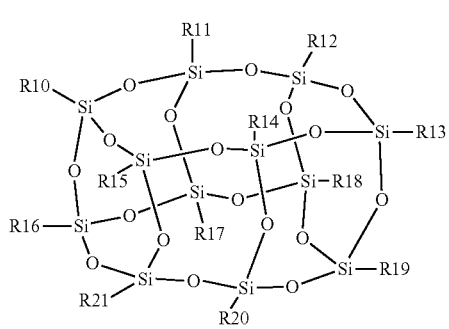

(23)

[chemical formula 24]

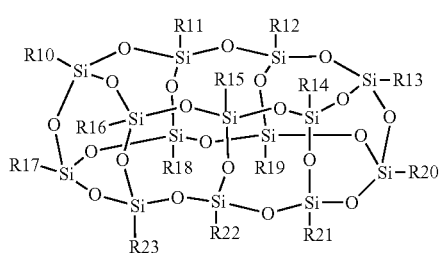

(24)

in the chemical formulas (21) to (24), R10, R11, R12, R13, R14, R15, R16, R17, R18, R19, R20, R21, R22, and R23 are one of a hydrogen atom, an unsaturated hydrocarbon group, and a saturated hydrocarbon group; and each of these unsaturated hydrocarbon groups and saturated hydrocarbon groups is one of vinyl, allyl, methyl, ethyl, propyl, isopropyl, and butyl group.

18. The method according to claim 15, wherein at least one of said organic siloxane compound materials is silsesquioxane represented by any one of the following chemical formulas (25), (26), (27), and (28).

[chemical formula 25]

(25)

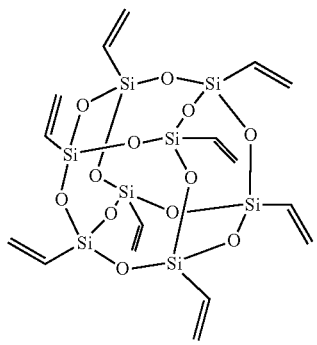

[chemical formula 26]

(26)

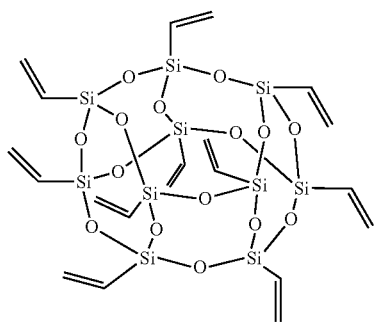

[chemical formula 27]

(27)

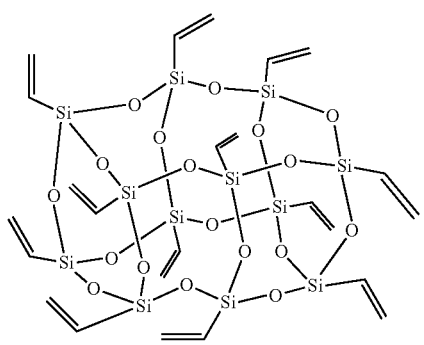

[chemical formula 28]

(28)

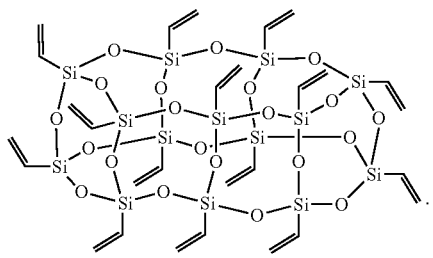

19. The method according to claim 16, wherein
one of said organic siloxane compound materials is said silsesquioxane;
another of said organic siloxane compound materials is cyclosiloxane having a structure of said chemical formula (1), where Rx and Ry are an unsaturated hydrocarbon or a hydrocarbon having a large steric hindrance; and
a source material obtained by dissolving said silsesquioxane into said cyclosiloxane is vaporized to produce said vaporized gas.

20. A method for producing a semiconductor device, comprising:
mixing and thereafter vaporizing two or more kinds of organic siloxane compound materials each having a cyclic SiO structure as a main skeleton and having different structures, or alternatively, simultaneously mixing and vaporizing said two or more kinds of organic siloxane compound materials, so as to produce a vaporized gas;
transporting said vaporized gas to a reaction furnace together with a carrier gas; and
forming in said reaction furnace a porous insulating film by the plasma CVD method or the plasma polymerization method using said vaporized gas,
wherein
two kinds of said organic siloxane compound materials are mixed and vaporized to produce said vaporized gas;
among said two kinds of said organic siloxane compound materials, a first source material has a structure of the following chemical formula (1):

[chemical formula 1]

(1)

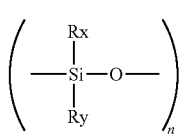

and n is n=E, and a second source material has a structure of said chemical formula (1) and n is n=F (in some cases, E=F); and
a mixing ratio (molar ratio) of said first and second source materials is set to be such that a ratio of said second source material relative to said first source material being assumed to be 1 is within a range of plus and minus 25% with E/F being a center.

21. The method according to claim 1, wherein
said two or more kinds of organic siloxane compound materials are mixed and stored in a vessel as a liquid source material at an ordinary temperature and under an ordinary pressure; and
said liquid source material is guided out of said vessel and thereafter vaporized to produce said vaporized gas.

22. The method according to claim 1, wherein
said two or more kinds of organic siloxane compound materials are respectively stored in individual vessels; and
said two or more kinds of organic siloxane compound materials are respectively guided out of said individual vessels, thereafter mixed with each other, and vaporized immediately after being mixed, or alternatively the mixing and vaporization are simultaneously carried out, so as to produce said vaporized gas.

23. The method according to claim 1, wherein, in forming said insulating film, an oxidizing gas selected from the group consisting of oxygen ($O_2$), carbon dioxide ($CO_2$), carbon monoxide (CO), nitrogen monoxide ($N_2O$), and nitrogen dioxide ($NO_2$) is introduced into a plasma generating apparatus, and said vaporized gas is made into a plasma.

24. A method for producing a semiconductor device, comprising:
mixing and thereafter vaporizing two or more kinds of organic siloxane compound materials each having a cyclic SiO structure as a main skeleton and having different structures, or alternatively, simultaneously mixing and vaporizing said two or more kinds of organic siloxane compound materials, so as to produce a vaporized gas;
transporting said vaporized gas to a reaction furnace together with a carrier gas; and
forming in said reaction furnace a porous insulating film by the plasma CVD method or the plasma polymerization method using said vaporized gas,
wherein said forming a porous insulating film includes forming a first porous insulating layer and forming a second porous insulating layer;
said organic siloxane compound material is supplied into a plasma generating apparatus together with a carrier gas, and said organic siloxane compound material is made into a plasma, so as to form said first and second porous insulating layers; and
a ratio ($a_2/b_2$) of a gas mass flow ($a_2$) of said organic siloxane compound material relative to a gas mass flow ($b_2$) of said carrier gas in forming said second porous insulating layer is larger than a ratio ($a_1/b_1$) of a gas mass flow ($a_1$) of said organic siloxane compound material relative to a gas mass flow ($b_1$) of said carrier gas in forming said first porous insulating layer.

25. The method according to claim 1, wherein, after said forming a porous insulating film, a curing treatment obtained by combining at least any one of a thermal curing treatment, an EB curing treatment, and a UV curing treatment is carried out on said porous insulating film.

26. The method according to claim 25, wherein said UV curing treatment is a treatment of radiating an ultraviolet ray onto said porous insulating film at a substrate temperature of 350 degree centigrade or higher.

27. The method according to claim 25, wherein a treatment time of said UV curing treatment is set to be a period of time such that an elastic modulus of said porous insulating film is improved as compared with that before said UV curing treatment and such that a k value of said porous insulating film is lower than that before said UV curing treatment.

28. The method according to claim 1, wherein said forming a porous insulating film does not include a porogen sublimation process and is carried out by setting a substrate temperature to be 350 degree centigrade or lower.

29. The method according to claim 1, wherein said two or more kinds of organic siloxane compound materials are different from each other in the molecular weight.

30. The method according to claim 1, wherein said two or more kinds of organic siloxane compound materials are different from each other in the molecular weight of side chains.

* * * * *